(12) United States Patent
Huang et al.

(10) Patent No.: US 11,695,039 B2
(45) Date of Patent: Jul. 4, 2023

(54) SEMICONDUCTOR DEVICE INCLUDING AN ACTIVE COMPONENT AND A BARRIER PATTERN SURROUNDING THE ACTIVE COMPONENT AND METHOD OF FORMING THE SAME

(71) Applicant: Taiwan Semiconductor Manufacturing Company, Ltd., Hsinchu (TW)

(72) Inventors: Chien-Hao Huang, Hsinchu (TW); Gao-Ming Wu, Hsinchu (TW); Yun-Feng Kao, Hsinchu (TW); Ming-Yen Chuang, Hsinchu (TW); Katherine H. Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/389,354

(22) Filed: Jul. 30, 2021

(65) Prior Publication Data
US 2023/0032528 A1  Feb. 2, 2023

(51) Int. Cl.
*H01L 29/08* (2006.01)
*H01L 21/8234* (2006.01)
(Continued)

(52) U.S. Cl.
CPC .. *H01L 29/0847* (2013.01); *H01L 21/823412* (2013.01); *H01L 21/823418* (2013.01); *H01L 29/1033* (2013.01); *H01L 29/66765* (2013.01)

(58) Field of Classification Search
CPC ........... H01L 29/42356; H01L 29/4236; H01L 27/108–10897; H01L 2924/1436–14369; H01L 27/1023; H01L 28/40–92; H01L 21/823425; H01L 29/0873; H01L 29/7839; H01L 29/806; H01L 29/7848; H01L 21/823418; H01L 21/823814; H01L 29/78624; H01L 29/7835; H01L 29/0843; H01L 51/105; H01L 29/41725;
(Continued)

(56) References Cited

U.S. PATENT DOCUMENTS

| 6,888,160 | B1 * | 5/2005 | Nakajima | ............. H01L 27/127 |
| | | | | 257/E29.294 |
| 2009/0225251 | A1 * | 9/2009 | Kaitoh | ................ H01L 27/1214 |
| | | | | 257/E33.053 |
| 2020/0343379 | A1 * | 10/2020 | Sharma | ................ H01L 29/458 |

\* cited by examiner

*Primary Examiner* — Sonya McCall-Shepard
(74) *Attorney, Agent, or Firm* — JCIPRNET

(57) ABSTRACT

Provided are a semiconductor device and method of forming the same. The semiconductor device includes active components and a first barrier pattern. The active components are on a substrate. Each of the active components includes base insulation patterns on the substrate, gate electrodes on the substrate and spaced apart from each other with the base insulation patterns interposed therebetween, a gate dielectric layer on the gate electrodes and the base insulation patterns, a channel pattern on the gate dielectric layer, source electrodes on the channel pattern and spaced apart from each other, a drain electrode on the channel pattern and between the source electrodes, and second insulation patterns between the source electrodes and the drain electrode. The first barrier pattern disposed on the gate dielectric layer surrounds the channel patterns, the source electrodes, the drain electrodes, and the second insulation patterns of each of the active components.

20 Claims, 20 Drawing Sheets

(51) Int. Cl.
*H01L 29/10* (2006.01)
*H01L 29/66* (2006.01)

(58) Field of Classification Search
CPC ........... H01L 27/1122; H01L 27/11273; H01L 27/11553; H01L 27/1158; H01L 29/66575; H01L 29/66659; H01L 29/66643; H01L 29/7809; H01L 27/07; H01L 29/78696; H01L 29/41766; H01L 29/41775; H01L 29/0649–0653; H01L 21/823412; H01L 21/823807; H01L 21/76224–76237; H01L 21/823481; H01L 21/823878; H01L 23/5329–53295; H01L 21/76801–76837; H01L 29/78669; H01L 29/78678; H01L 29/66765; H01L 29/78648; H01L 51/0508–0516; H01L 29/0847; H01L 29/1033; H01L 29/07; G11C 11/401–4099; G11C 14/0009–0045; G11C 2211/4016
See application file for complete search history.

SEMICONDUCTOR DEVICE INCLUDING AN ACTIVE COMPONENT AND A BARRIER PATTERN SURROUNDING THE ACTIVE COMPONENT AND METHOD OF FORMING THE SAME

BACKGROUND

In recent years, the semiconductor industry has experienced rapid growth due to continuous improvement in integration density of various electronic components, such as transistors, diodes, resistors, capacitors, or the like. Such improvement in integration density is mostly attributed to successive reductions in minimum feature sizes, which allows more components to be integrated into a given area.

As the integration density of various electronic components continues to increase, there exists an increasing number and complexity of wirings used to communicate those electronic components, and thus the length of interconnections is taken into consideration. Three-dimensional (3D) integration (e.g., integrating some components in a back end of line (BEOL) process) provides improved integration density and other advantages, such as faster speeds and higher bandwidth, because of the decreased length of interconnections between the components. However, there are quite a few challenges to be handled for the technology of 3D integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
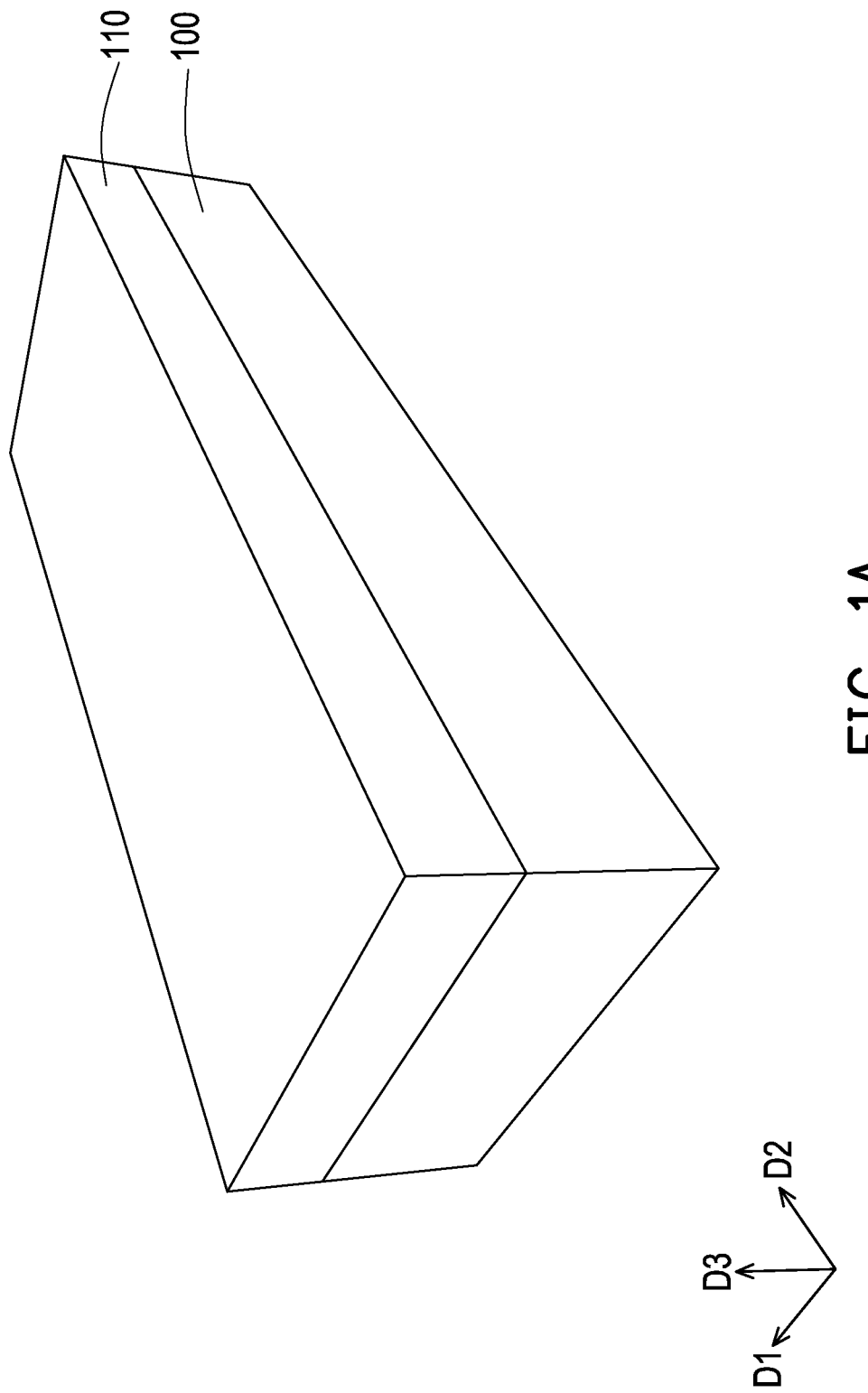
FIG. 1A to FIG. 1H are schematic perspective views that illustrate a method of forming a semiconductor device in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a first barrier pattern surrounds channel pattern, source electrodes, a drain electrode, and first insulation patterns in each of the active components, so that device electrical properties of each of the active components can be improved and stand stable.

FIG. 1A to FIG. 1H are schematic perspective views that illustrate a method of forming a semiconductor device in accordance with a first embodiment. The semiconductor device illustrated in the following embodiments may be applied to, but are not limited thereto.

Figure 1B:
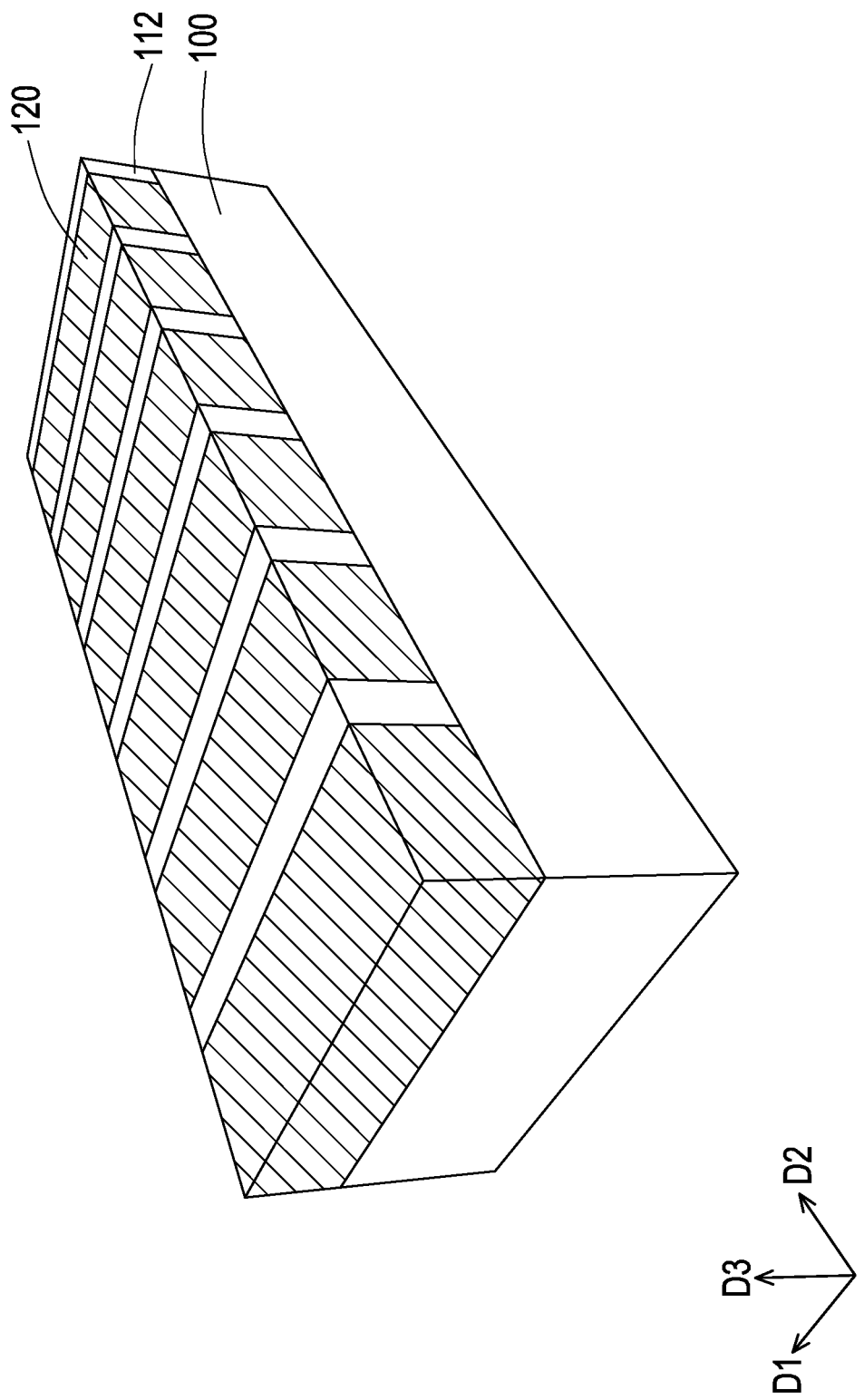
Figure 1C:
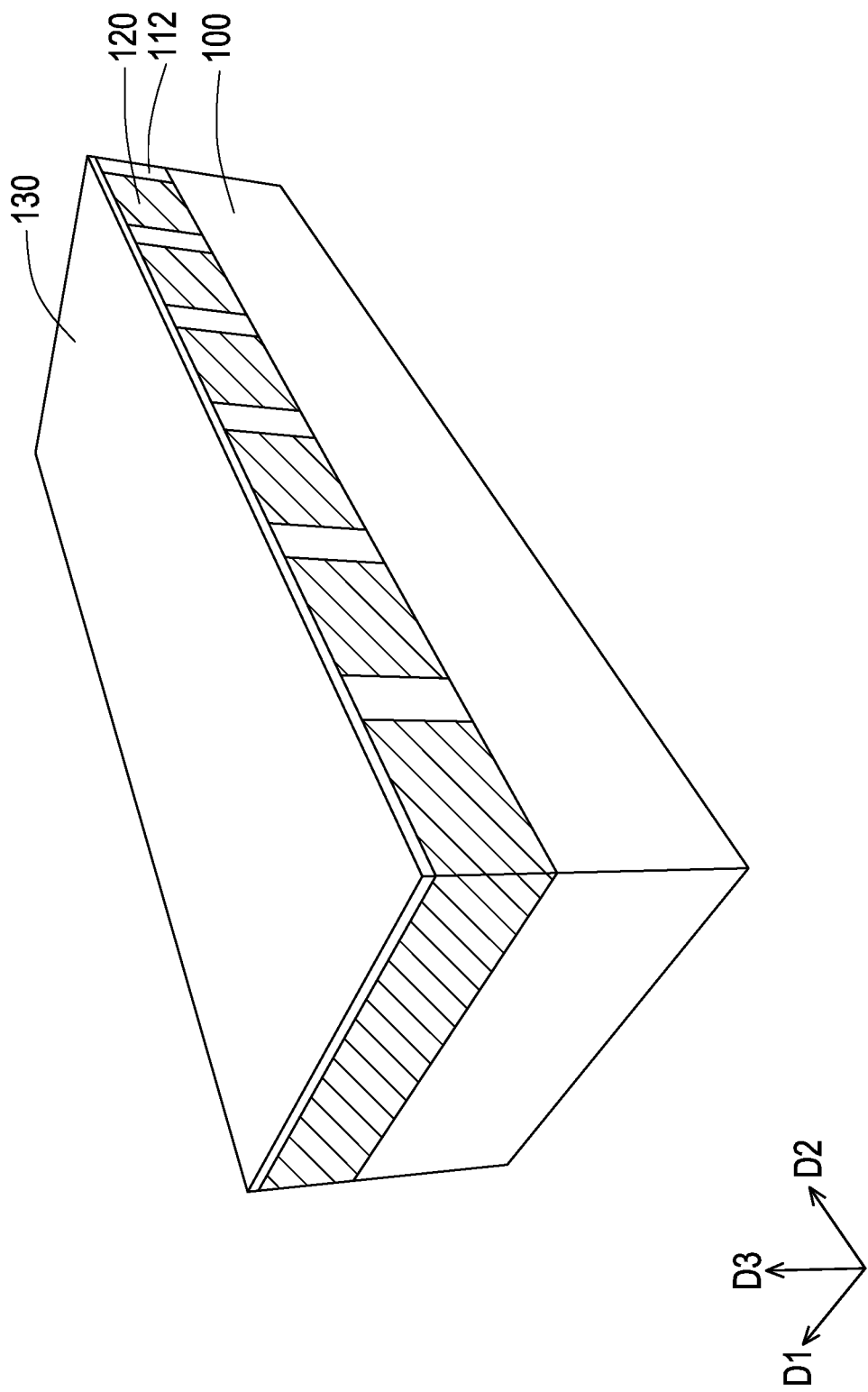
Figure 1D:
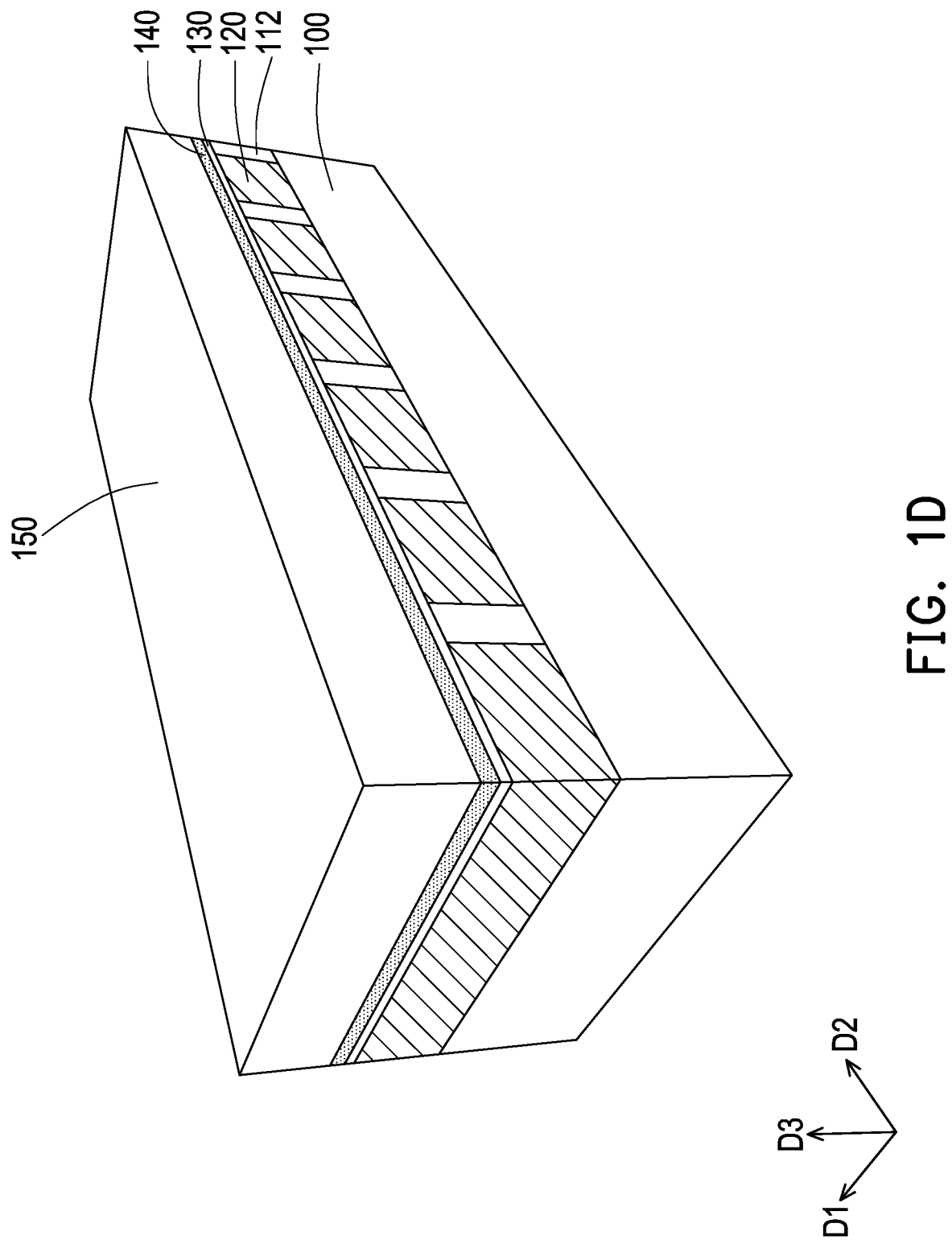
Figure 1E:
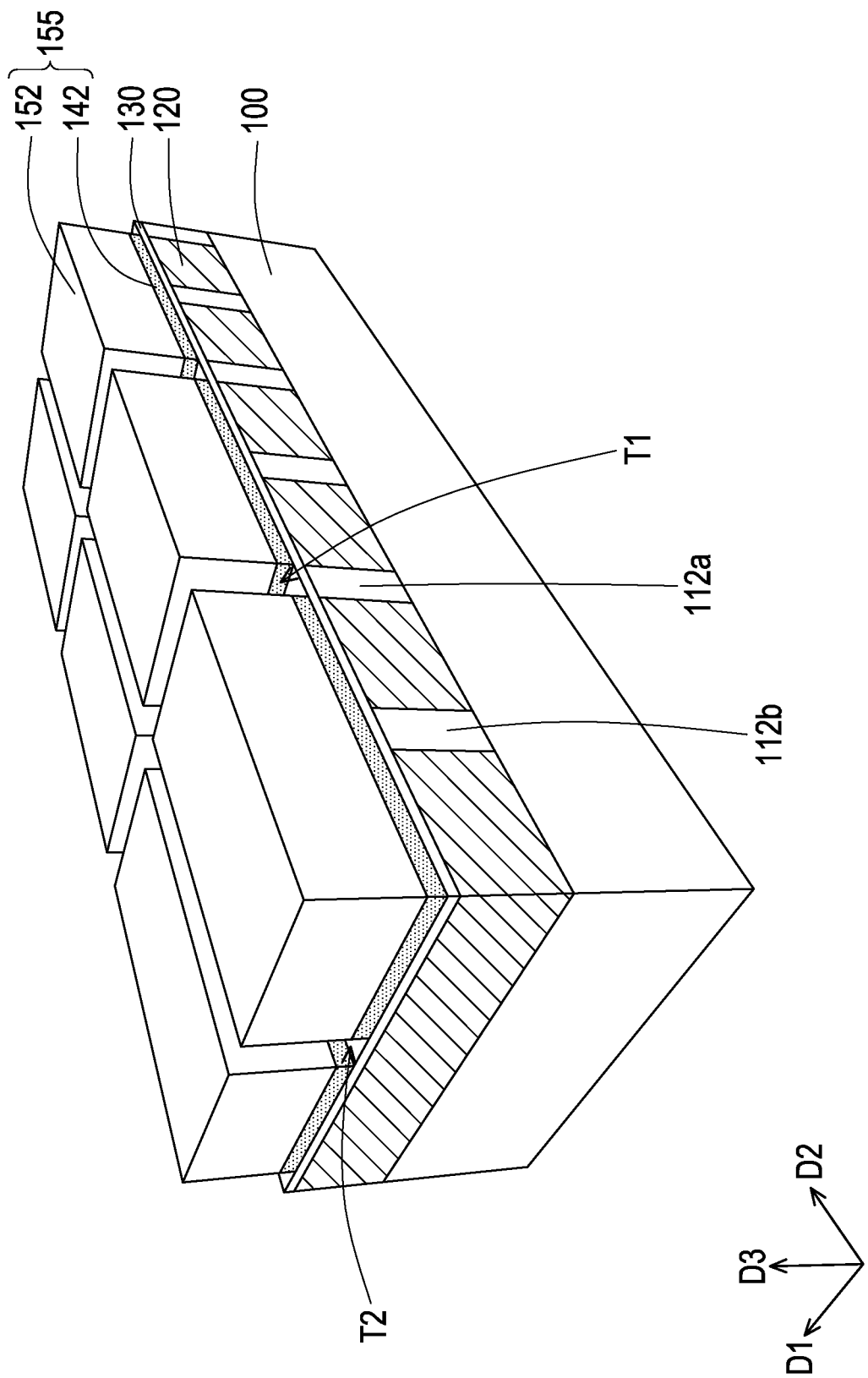
Figure 1F:
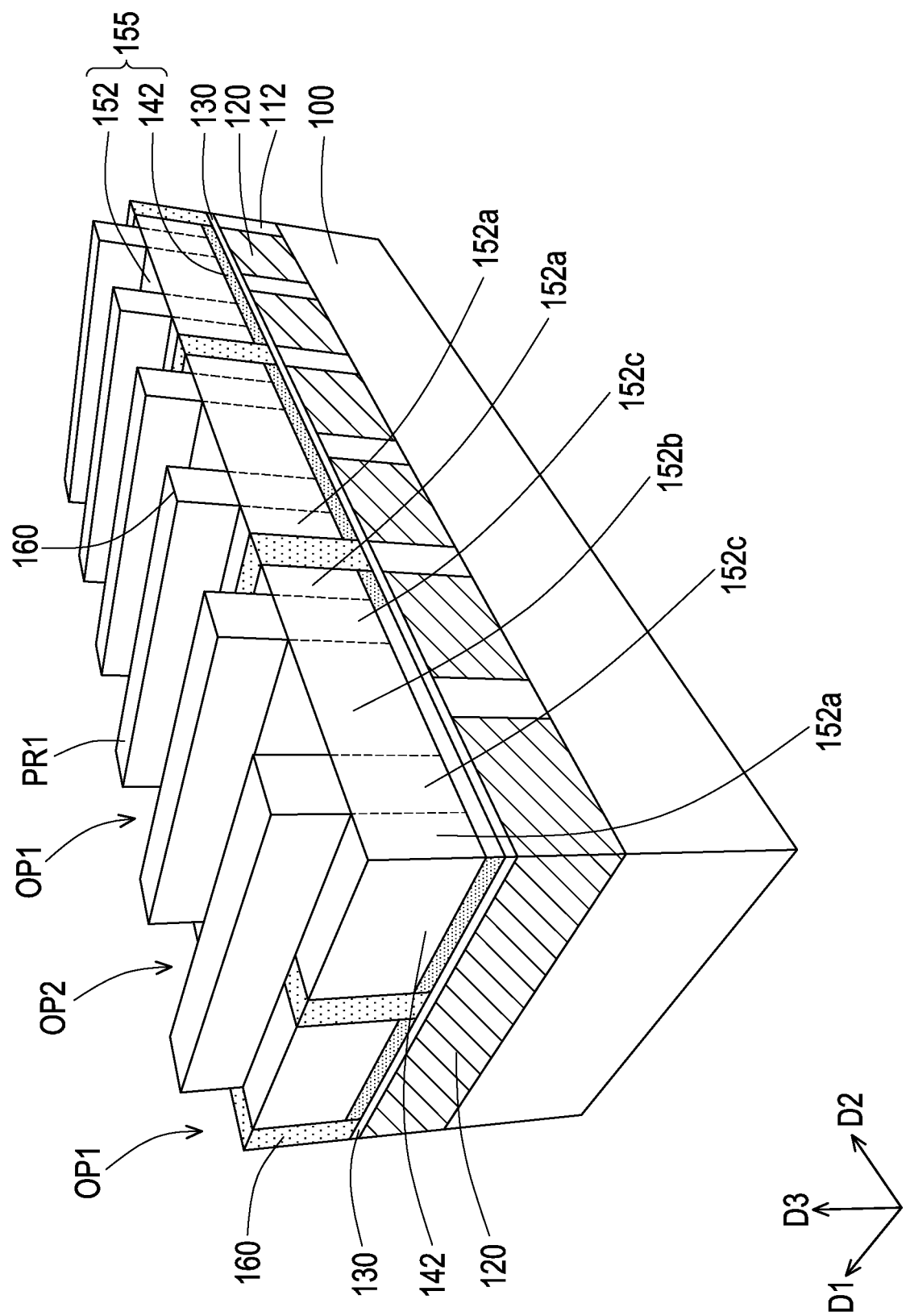
Figure 1G:
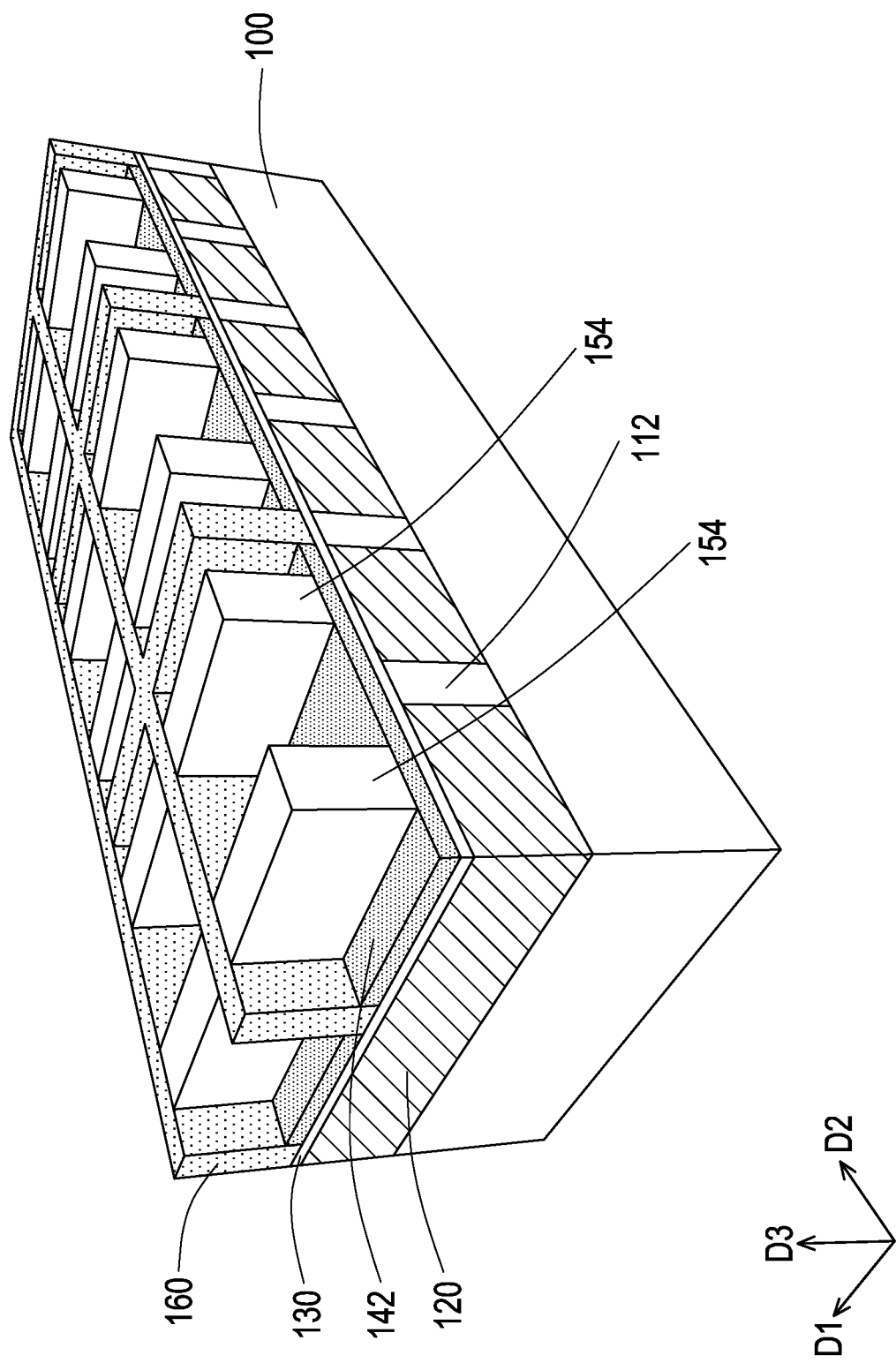
Figure 1H:
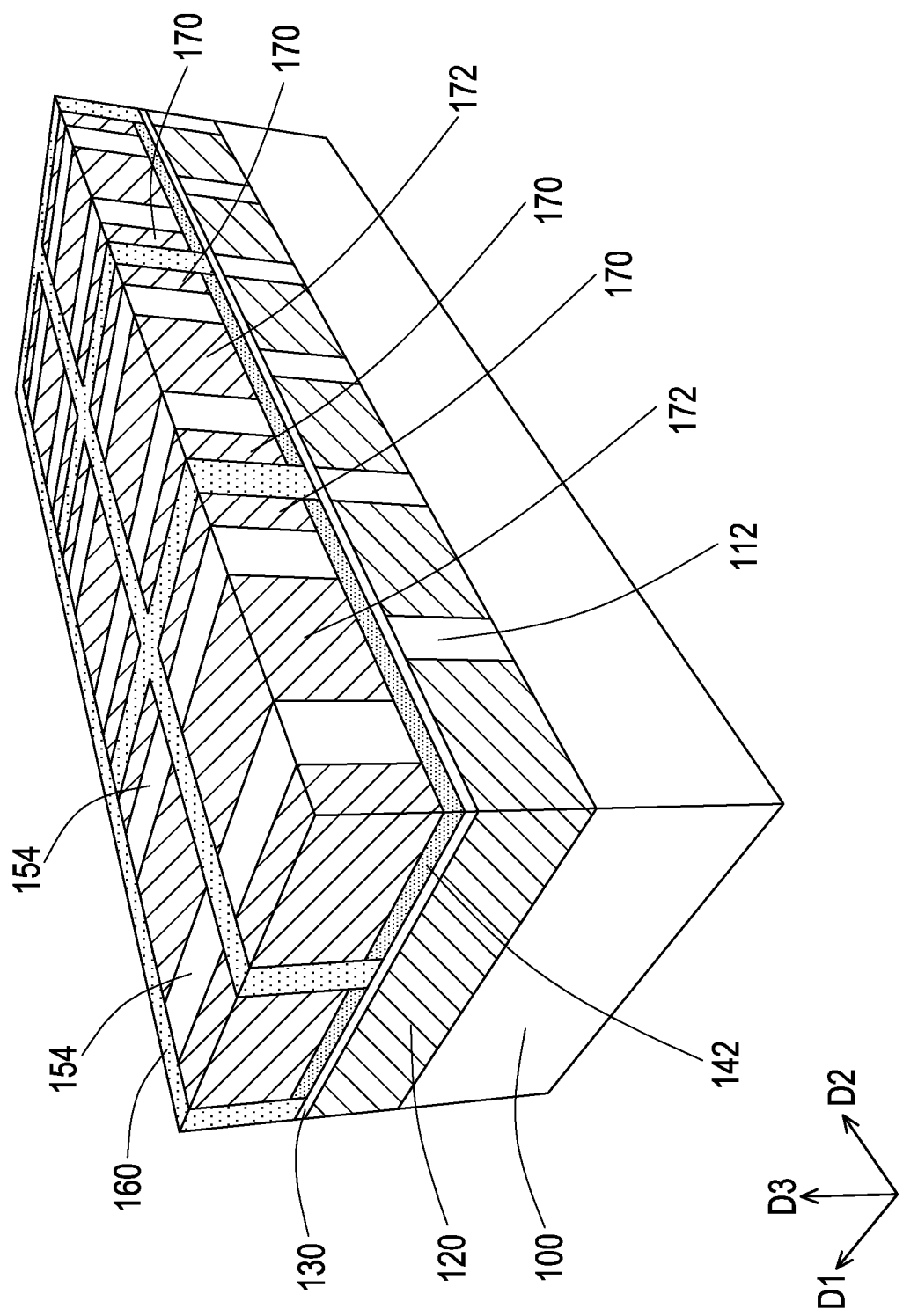

Referring to FIG. 1A, a method of forming a semiconductor device 10 (as shown in FIG. 1H) includes following steps. Firstly, a base insulation layer 110 is formed on the substrate 100. In some embodiments, the substrate 100 may include layers, structures, and/or components formed in a back end of line (BEOL) process. For example, the substrate 100 may include intermetal dielectric (IMD) layers, vias, wiring layers, active components (e.g., transistor) and/or passive components (e.g., capacitor). In some alternative embodiments, the substrate 100 may include layers, structures, and/or components formed in a front end of line (FEOL) process. For example, the substrate 100 may include a device layer formed on a semiconductor substrate. The device layer may include a wide variety of devices and interlayer dielectric (ILD) layers covering the devices. In some embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device layer includes a gate structure, source and drain regions, and isolation structures such as shallow trench isolation (STI) structures. In the device layer, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the semiconductor substrate. The functions of the devices may include memory, processors, sensors, amplifiers, power distribution, input/output circuitry, or the like.

The semiconductor substrate may be a bulk semiconductor, a semiconductor-on-insulator (SOI) substrate, or the like. The semiconductor substrate may be doped (e.g., with a p-type or an n-type dopant) or undoped. The semiconductor substrate may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. In some embodiments, the semiconductor substrate may include an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the base insulation layer 110 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The base insulation layer 110 may be formed by any suitable method, such as chemical vapor deposition (CVD).

Referring to FIG. 1A and FIG. 1B, the base insulation layer 110 is then patterned to form base insulation patterns 112 spaced apart from each other on the substrate 100. In some embodiments, the base insulation patterns 112 may extend in a first direction D1 and space apart from each other in a second direction D2 different from the first direction D1, but is not limited thereto. In some embodiments, the first direction D1 may interlace with the second direction D2. In some alternative embodiments, the first direction D1 may be perpendicular to the second direction D2. In some embodiments, the base insulation patterns 112 may be formed by following steps. Firstly, a mask pattern (not illustrated) is formed on the base insulation layer 110. The mask pattern may be a patterned photoresist layer. Then, portions of the base insulation layer 110 exposed by the mask pattern are removed to form the base insulation patterns 112. The portions of the base insulation layer 110 may be removed by an etching process. The substrate 100 may serve as a stop layer during the process of removing the portions of the base insulation layer 110. After forming the base insulation patterns 112, the mask pattern is removed by any suitable method, such as ashing.

Referring to FIG. 1B, gate electrodes 120 are formed on the substrate 100 between the base insulation patterns 112. In some embodiments, the gate electrodes 120 may extend in the first direction D1 and space apart from each other with the base insulation patterns 112 interposed therebetween. In some embodiments, the top surfaces of the gate electrodes 120 may be substantially coplanar with top surfaces of the base insulation patterns 112. In some embodiments, the gate electrodes 120 are formed by following steps. Firstly, a gate electrode layer (not shown) is formed on the substrate 100 to cover the base insulation patterns 112. The gate electrode layer may be formed by any suitable method, such as CVD, physical vapor deposition (PVD), or the like. Then, a planarization process (e.g., a chemical mechanical planarization (CMP) process) is performed to remove a portion of the gate electrode layer on the base insulation patterns 112 to form the gate electrodes 120. The gate electrodes 120 may include commonly used gate material such as doped polysilicon, metal (e.g., tungsten, aluminum, etc.), silicide (e.g., titanium silicide, nickel silicide, etc.), or some other suitable conductive materials.

Referring to FIG. 1C, a gate dielectric layer 130 is formed on the base insulation patterns 112 and the gate electrodes 120. The gate dielectric layer 130 may include commonly used gate dielectric material such as oxides (e.g., $SiO_2$), high-k dielectric materials (e.g., a dielectric material with a dielectric constant greater than 3.9), or some other suitable dielectric materials. The gate dielectric layer 130 may be formed by any suitable method, such as CVD.

Referring to FIG. 1D, a channel layer 140 is formed on the gate dielectric layer 130, and a first insulation layer 150 is then formed on the channel layer 140. In some embodiments, the channel layer 140 may include oxide semiconductor, such as indium gallium zinc oxide (IGZO), zinc oxide (ZnO), indium tungsten oxide (IWO), or the like. The channel layer 140 may be formed by any suitable method, such as CVD, PVD, atomic layer deposition (ALD), or the like. In some embodiments, the first insulation layer 150 may include a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The first insulation layer 150 may be formed by any suitable method, such as CVD.

Referring to FIG. 1D and FIG. 1E, the first insulation layer 150 and the channel layer 140 are patterned to form stacks 155 spaced apart from each other on the gate dielectric layer 130. Each of the stacks 155 includes a channel pattern 142 on the gate dielectric layer 130 and a first insulation pattern 152 stacked on the channel pattern 142. In some embodiments, the stacks 155 may be arranged in an array on the gate dielectric layer 130, but are not limited thereto. In some embodiments, the stacks 155 may be formed by following steps. Firstly, a mask pattern (not illustrated) is formed on the first insulation layer 150. The mask pattern may be a patterned photoresist layer. Then, portions of the first insulation layer 150 exposed by the mask pattern and portions of the channel layer 140 under the portions of the first insulation layer 150 are removed to form the stacks 155 including the channel pattern 142 on the gate dielectric layer 130 and the first insulation pattern 152 stacked on the channel pattern 142. The portions of the first insulation layer 150 and the portions of the channel layer 140 may be removed by an etching process. The gate dielectric layer 130 may serve as a stop layer during the process of removing the portions of the first insulation layer 150 and the portions of the channel layer 140. After forming the stacks 155, the mask pattern is removed by any suitable method, such as ashing.

Referring to FIG. 1E, in some embodiments, first trenches T1, formed between the stacks 155 in the second direction D2, may extend in the first direction D1 and arrange in the second direction D2, and second trenches T2, formed between the stacks 155 in the first direction D1, may extend in the second direction D2 and arrange in the first direction D1. In some embodiments, the first trenches T1 and the second trenches T2 may be interlaced with each other to form a grid or mesh pattern in a top view. Each of the first trenches T1 may have a width ranging from about 10 nm to about 30 nm in the second direction D2. Each of the second trenches T2 may have a width ranging from about 10 nm to about 30 nm in the first direction D1. In some embodiments, the widths of the first trenches T1 in the second direction D2 may be about equal to the widths of the second trenches T2 in the first direction D1.

In some embodiments, the base insulation patterns 112 may include first portions 112a overlapping with the first trenches T1 in a third direction D3 perpendicular to the first direction D1 and the second direction D2 and second portions 112b overlapping with the stacks 155 in the third direction D3. The first and second portions 112a and 112b of the base insulation patterns 112 are arranged alternatively in the second direction D2. In some embodiments, the first portions 112a of the base insulation patterns 112 may be located between the stacks 155 spaced apart from each other in the second direction D2 in a top view, and the second portion 112b of the base insulation patterns 112 may be located under the stacks 155 spaced apart from each other in the first direction D1. In some embodiments, the widths of the first trenches T1 in the second direction D2 may be about equal to or less than widths of the first portions 112a of the base insulation patterns 112 in the second direction D2.

In some embodiments, top surfaces of portions of the gate dielectric layer 130 exposed by the first trenches T1 and the second trenches T2 may be substantially coplanar with top surfaces of portions of the gate dielectric layer 130 under the stacks 155. In some alternative embodiments, the top surfaces of the portions of the gate dielectric layer 130 exposed by the first trenches T1 and the second trenches T2 may be slightly over-etched during the process of patterning the insulation layer 150 and the channel layer 140, so that the top surfaces of the portions of the gate dielectric layer 130 exposed by the first trenches T1 and the second trenches T2 may be lower than the top surfaces of the portions of the gate dielectric layer 130 under the stacks 155.

Referring to FIG. 1E and FIG. 1F, a first barrier pattern 160 is formed on the gate dielectric layer 130 to surround each of the stacks 155. In some embodiments, the first barrier pattern 160 may be formed as a grid or mesh pattern in a top view, and the stacks 155 may fill in openings of the grid or mesh pattern. In some embodiments, the first barrier pattern 160 may be formed by following steps. Firstly, a barrier material is formed on the gate dielectric layer 130 exposed by the stacks 155 and fill the first trenches T1 and second trenches T2. The barrier material may cover top surfaces of the stacks 155. Then, a planarization process (e.g., a CMP process) is performed to remove excessive barrier material, so that the barrier pattern 160 may be formed in the first trenches T1 and second trenches T2 to surround each of the stacks 155. The first barrier pattern 160 may include or may be formed of an insulating material having a different etch selectivity from the first insulation patterns 152. As such, the first barrier pattern 160 may serve as a mask during a process of patterning the first insulation patterns 152 in subsequent processes for forming a self-aligned source/drain. For example, the first barrier pattern 160 may include aluminum oxide, titanium oxide, silicon nitride, or the like. In some embodiments, the barrier material may include materials which can be treat as an absorption source to protect the channel patterns 142 from impurities and/or interstitial atoms (e.g., hydrogen atom, oxygen atom, or the like) to make device electrical properties healthier and more stable. For example, the first barrier pattern 160 may include materials such as aluminum oxide, titanium oxide, or the like. The barrier material may be formed by any suitable method, such as CVD, PVD, ALD, or the like.

Referring to FIG. 1F and FIG. 1G, each of the first insulation patterns 152 is patterned to form second insulation patterns 154 spaced apart from each other in the second direction D2 on each of the channel pattern 142. In some embodiments, the second insulation patterns 154 are formed by following steps. Firstly, a mask pattern PR1 is formed on the first insulation patterns 152. The mask pattern PR1 may include first openings OP1 and second openings OP2 between the first openings OP1, wherein the first openings OP1 expose first portions 152a of the first insulation patterns 152 and portions of the first barrier pattern 160 between the first portions 152a of the first insulation patterns 152, and the second openings OP2 expose second portions 152b of the first insulation patterns 152 between the first portions 152a of the first insulation patterns 152. The mask pattern PR1 covers third portions 152c of the first insulation patterns 152 between the first portions 152a and second portions 152b of the first insulation patterns 152. The mask pattern may be a patterned photoresist layer. Then, the first portions 152a and second portions 152b of the first insulation patterns 152 are removed respectively through the first openings OP1 and the second openings OP2 of the mask pattern PR1 to form the second insulation patterns 154 on each of the channel patterns 142. The first portions 152a and second portions 152b of the first insulation patterns 152 are removed by an etching process. Since the first barrier pattern 160 includes or is formed of an insulating material having a different etch selectivity from the first insulation patterns 152, the first barrier pattern 160 may serve as a mask during the process of patterning the first insulation patterns 152. In other words, portions of the first barrier pattern 160 exposed by the mask pattern PR1, such as portions of the first barrier pattern 160 between the second portions 152b of the first insulation patterns 152 and portions of the first barrier pattern 160 between the first portions 152a of the first insulation patterns 152, may retain on the gate dielectric layer 130. The channel patterns 142 may serve as a stop layer during the process of patterning the first insulation patterns 152. After forming the second insulation patterns 154, the mask pattern PR1 is removed by any suitable method, such as ashing.

Referring to FIGS. 1G and 1H, source electrodes 170 are formed between the first barrier pattern 160 and the second insulation patterns 154 on each of the channel patterns 142, and a drain electrode 172 is formed between the second insulation patterns 154 on each of the channel patterns 142. In some embodiments, the drain electrode 172 may be located between the source electrodes 170 in a top view. In some embodiments, the source electrodes 170 and the drain electrodes 172 may be formed by following steps. Firstly, a conductive material (not shown) is formed on the channel patterns 142 to cover the second insulation patterns 154 and the first barrier pattern 160. The conductive material may cover top surfaces of the second insulation patterns 154 and a top surface of the first barrier pattern 160. The conductive material may be formed by any suitable method, such as CVD, PVD, or the like. Then, a planarization process (e.g., CMP process) is performed to remove a portion of the conductive material on the top surfaces of the second insulation patterns 154 and the top surface of the first barrier pattern 160 to form the source electrodes 170 and the drain electrodes 172. The top surfaces of the source electrodes 170 and the drain electrodes 172 may be coplanar with the top surfaces of the second insulation patterns 154 and the first barrier pattern 160. The source electrodes 170 may include commonly used source material such as Al, Ti, TiN, W, Mo, indium tin oxide (ITO), or some other suitable conductive materials. The drain electrodes 172 may include commonly used drain material such as Al, Ti, TiN, W, Mo, indium tin oxide (ITO), or some other suitable conductive materials.

In some embodiments, each of the drain electrodes 172 may include a first portion overlapping one of the gate electrodes 120 in the third direction D3, a second portion overlapping another one of the gate electrodes 120 in the third direction D3, and a third portion between the first portion and the second portion of the drain electrode 172. The third portion of the drain electrode may overlap the channel pattern 142 in the third direction D3.

In some embodiments, each of the channel pattern 142 may include first sidewalls and second sidewalls that are in contact with the first barrier pattern 160. The first sidewalls of the channel pattern 142 are opposite to each other and extend in the first direction D1. The second sidewalls of the channel pattern 142 are opposite to each other and extend in the second direction D2. In the case where the first barrier pattern 160 includes or is formed of an insulating material having a different etch selectivity from the first insulation patterns 152. The first barrier pattern 160 may serve as a mask during the process of patterning the first insulation patterns 152, so that the source electrodes 170 formed between the second insulation patterns 154 and the first barrier pattern 160 may be considered as self-aligned sources. Namely, as shown in FIG. 1H, the first sidewalls of the channel pattern 142 are substantially coplanar with sidewalls of the source electrodes 170 that are in contact with the first barrier pattern 160 and extend in the first direction D1, and the second sidewalls of the channel pattern 142 are substantially coplanar with sidewalls of the source electrodes 170 that are in contact with the first barrier pattern 160 and extend in the second direction D2. The drain electrodes 172 formed between the second insulation patterns 154 in the second direction D2 and between portions of the first barrier pattern 160 formed in the second trenches T2 (see FIG. 1E) in the first direction D1 may also be considered as self-aligned drains. Namely, as shown in FIG. 1H, the second sidewalls of the channel pattern are substantially coplanar with sidewalls of the drain electrode 172 that are in contact with the first barrier pattern 160. On the other hands, the second sidewalls of the channel pattern 142 may be substantially coplanar with sidewalls of the second insulation patterns 154 that are in contact with the first barrier pattern 160.

From the foregoing processes, the method of forming the semiconductor device 10, as shown in FIG. 1H, may achieve a self-aligned device without overlay shift in photo lithography processes, which may reduce the process variation and enlarge the gate width and gate-controlled channel area, thereby improving the consistency of device electrical properties and device performance. Also, the masks used in the processes of forming the semiconductor device 10 can be reduced and thus the cost of the process is competitive. On the other hands, upon the foregoing processes of forming the semiconductor device 10, the semiconductor device 10 may be suitable to apply to any BEOL process.

Referring to FIG. 1H, the semiconductor device 10 may include active components AC1 arranged in an array on the substrate 100. In some embodiments, each of the active components AC1 may include one of the channel patterns 142, a portion of the gate dielectric layer 130 under the one of the channel patterns 142, portions of the gate electrodes 120 under the one of the channel patterns 142, a portion of the base insulation pattern 112 under the one of the channel patterns 142, the source electrodes 170 on the one of the channel patterns 142, one of the drain electrode 172 on the one of the channel patterns 142, and the second insulation patterns 154 on the one of the channel patterns 142. Namely, each of the active components AC1 in the semiconductor device 10 shown in FIG. 1H may include two transistors (e.g., thin film transistors (TFT)). Since the first barrier pattern 160 surrounds the channel patterns 142, the source electrodes 170, the drain electrodes 172, and the second insulation patterns 154 of the active components AC1, electrical properties of the transistors included in the active components AC1 can be improved and stand stable.

In some embodiments, when the semiconductor device 10 is applied to a memory device such as DRAM (e.g., a one-transistor and one-capacitor (1T1C) DRAM, a three-transistor and one capacitor (3T1C) DRAM, a capacitor over bit line (COB) DRAM, or the like), the source electrodes 170 may be connected to capacitors, the drain electrodes 172 may be connected to bit lines, and the gate electrodes 120 may serve as word lines and may be electrically connected to the devices in the substrate 100, but are not limited thereto.

Figure 2:
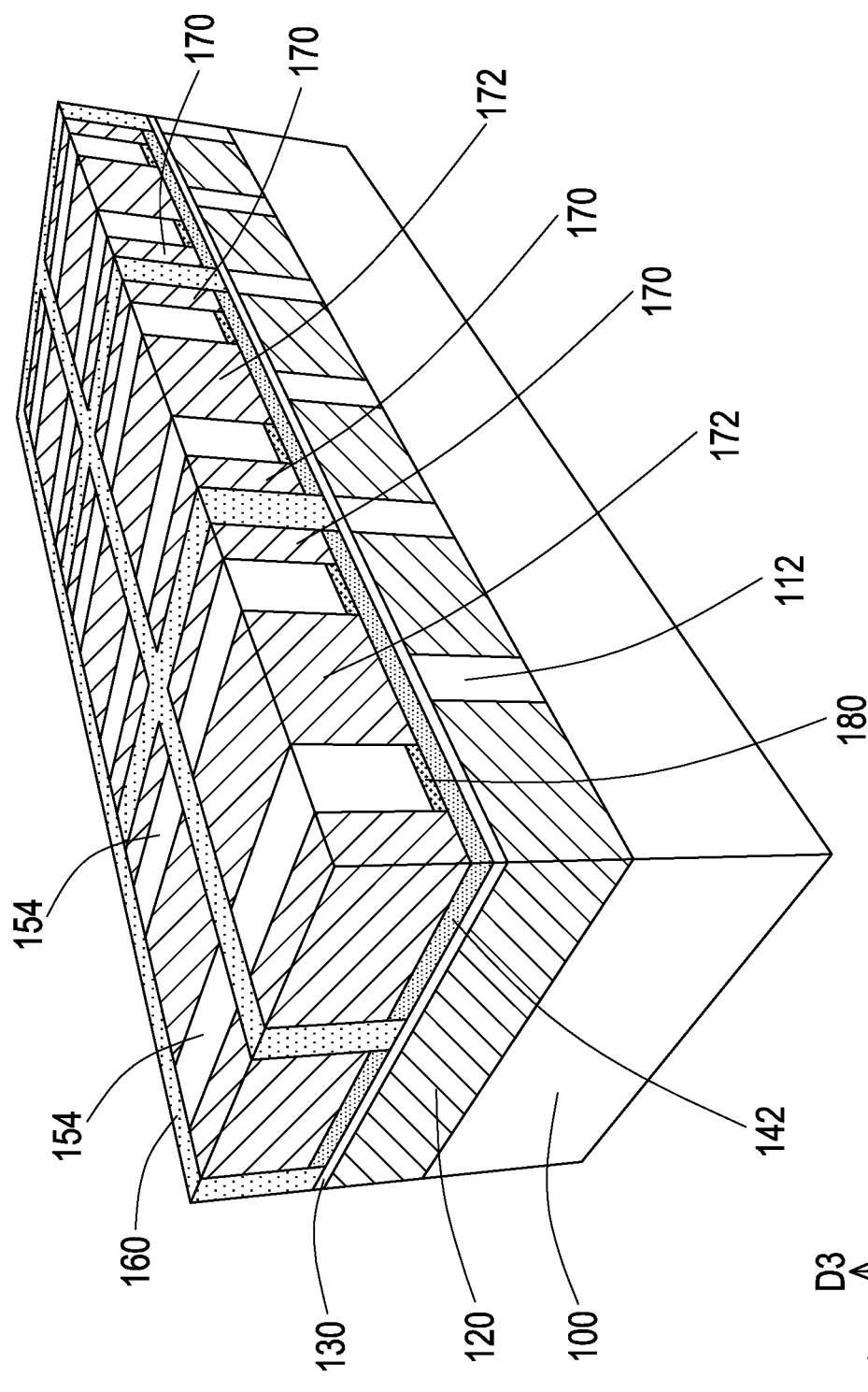
FIG. 2 is a schematic perspective view illustrating a semiconductor device in accordance with a second embodiment.

FIG. 2 is a schematic perspective view illustrating a semiconductor device in accordance with a second embodiment.

Referring to FIG. 2, a semiconductor device 20 of the second embodiment is similar to the semiconductor device 10 of the first embodiment. That is, the structures, materials, and functions of active components AC2 in the semiconductor device 20 are similar to those of the active components AC1 in the semiconductor device 10, and thus the details are omitted herein. The main difference between the active components AC2 and the active components AC1 lies in that each of the active components AC2 further includes second barrier patterns 180 between the second insulation patterns 154 and the channel pattern 142. The second barrier patterns 180 may provide a protection from impurities and/or interstitial atoms (e.g., hydrogen atom, oxygen atom, or the like) to make device electrical properties healthier and more stable. For example, the second barrier patterns 180 may include materials which can be treat as an absorption source to protect the channel patterns 142 from the impurities and/or interstitial atoms to make device electrical properties healthier and more stable. For example, the second barrier patterns 180 may include materials such as aluminum oxide, titanium oxide, or the like. The second barrier patterns 180 may be formed by any suitable method, such as CVD, PVD, ALD, or the like. The thickness of the second barrier patterns 180 in the third direction D3 may be about 15 nm to about 100 nm.

In some embodiments, a method of forming the second barrier patterns 180 may include following steps. Firstly, a barrier layer (not shown) is formed on the channel layer 140 before the first insulation layer 150 is formed on the channel layer 140 (see FIG. 1D). Next, the first insulation layer 150, the barrier layer, and the channel layer 140 are patterned to form the first insulation patterns 152, the barrier patterns, and the channel patterns 142 (see FIG. 1E). Then, the barrier patterns are patterned during the process of patterning the first insulation patterns 152 to form the second barrier patterns 180 between the second insulation patterns 154 and the channel patterns 142 (see FIG. 1F and FIG. 1G).

Figure 3:
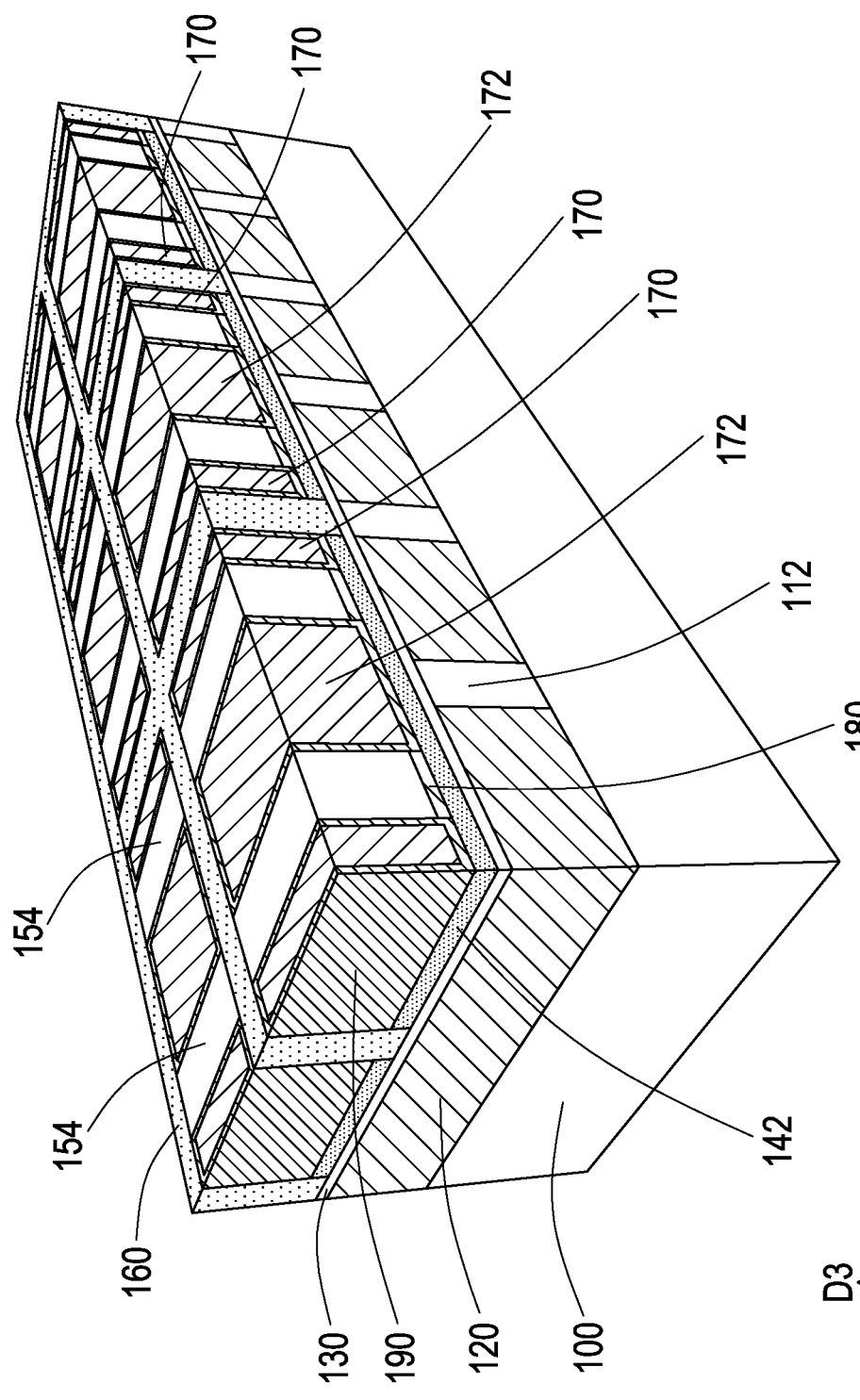
FIG. 3 is a schematic perspective view illustrating a semiconductor device in accordance with a third embodiment.

FIG. 3 is a schematic perspective view illustrating a semiconductor device in accordance with a third embodiment.

Referring to FIG. 3, a semiconductor device 30 of the third embodiment is similar to the semiconductor device 20 of the second embodiment. That is, the structures, materials, and functions of active components AC3 in the semiconductor device 30 are similar to those of the active components AC2 in the semiconductor device 20, and thus the details are omitted herein. The main difference between the active components AC3 and the active components AC2 lies in that each of the active components AC3 further includes conductive patterns 190 between the source electrodes 170 and the channel pattern 142 and between the drain electrode 172 and the channel pattern 142. The conductive patterns 190 may include a low-resistivity material to turn the Schottky contact between the source electrodes 170 and the channel pattern 142 and between the drain electrode 172 and the channel pattern 142 into Ohmic contact. Also, since the conductive patterns 190 are formed before the process of forming the source electrodes 170 and the drain electrode 172 and after the process of patterning the first insulation pattern 152 (see FIG. 1G), the conductive patterns 190 may ameliorate interfaces between the source electrodes 170 and the channel pattern 142 and between the drain electrode 172 and the channel pattern 142. That is because the conductive patterns 190 may capture impurities and/or interstitial atoms (e.g., hydrogen atom) on regions of the channel patterns 142 on which the source electrodes 170 and the drain electrode 172 are formed in the subsequent process. Based on the above, the conductive patterns 190 may improve the performance of the active components AC3 by decreasing parasitic resistance between the source electrodes 170 and the channel patterns 142 and between the drain electrode 172 and the channel patterns 142 to have better control on the channels.

In some embodiments, a method of forming the conductive patterns 190 may include following steps. Firstly, a conductive layer (not shown) is formed on the channel layer 140 before the source electrodes 170 and the drain electrode 172 are formed on the channel layer 140 (see FIG. 1G). The conductive layer may be formed by any suitable method, such as CVD, physical vapor deposition (PVD), or the like. The conductive layer may be form on top surfaces and sidewalls of the second insulation patterns 154 and a top surface and sidewalls of the first barrier pattern 160. Then, the conductive layer on the top surfaces of the second insulation patterns 154 and on the top surface of the first barrier pattern 160a are removed to form the conductive patterns 190.

The conductive patterns 190 may include oxide semiconductors such as indium IGZO, indium oxide (InO), ZnO, indium zinc oxide (IZO), or the like. In some embodiments, the conductive patterns 190 may include some materials included in the channel pattern 142. The conductive patterns 190 may be formed by any suitable method, such as CVD, PVD, ALD, or the like.

Figure 4:
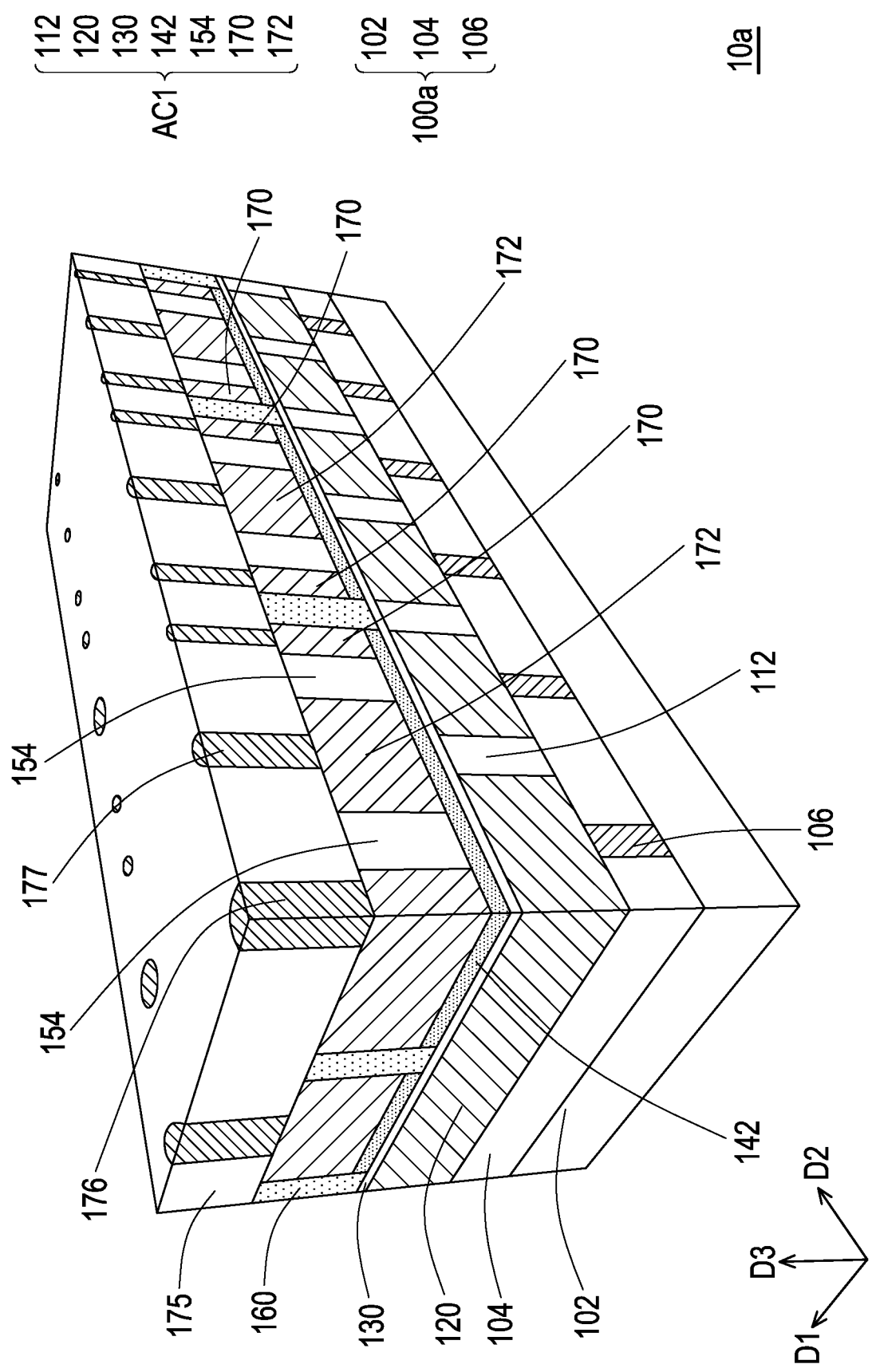
FIG. 4 is a schematic perspective view illustrating a semiconductor device in accordance with a fourth embodiment.

FIG. 4 is a schematic perspective view illustrating a semiconductor device in accordance with a fourth embodiment.

Referring to FIG. 4, a semiconductor device 10a of the fourth embodiment is similar to the semiconductor device 10 of the first embodiment. One of differences between the semiconductor device 10a and the semiconductor device 10 lies in that the substrate 100a of the semiconductor device 10a includes a base substrate 102, a first dielectric layer 104 on the base substrate 102, and first conductors 106 in the first dielectric layer 104. In some embodiments, the base substrate 102 may include a semiconductor substrate, a device layer on the semiconductor substrate, and an interconnection layer on the device layer. The semiconductor substrate may be a bulk semiconductor, a semiconductor-on-insulator (SOI) substrate, or the like. The device layer may include a wide variety of devices and ILD layers covering the devices. Another one of differences between the semiconductor device 10a and the semiconductor device 10 lies in that the semiconductor device 10a further includes a second dielectric layer 175, second conductors 176, and third conductors 177. The second dielectric layer 175 disposes on the first barrier pattern 160, the second insulation patterns 154, the source electrodes 170, and the drain electrodes 172. The second conductors 176 are disposed in the second dielectric layer 175 and electrically connected to the source electrodes 170. The third conductors 177 are disposed in the second dielectric layer 175 and electrically connected to the drain electrodes 172.

In some embodiments, the first dielectric layer 104 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The first dielectric layer 104 may be formed by any suitable method, such as CVD, PVD, ALD, or the like. In some embodiments, the first conductors 106 may be conductive plugs and may include conductive materials, such as metals or metal alloys including one or more of Al, AlCu, Cu, Ti, TiN, W, or the like. The first conductors 106 may be formed by any suitable method, such as CVD, PVD, or the like. In some embodiment, the first conductors 106 may have circular shape in a top view, but are not limited thereto.

In some embodiments, the second dielectric layer 175 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The second dielectric layer 175 may be formed by any suitable method, such as CVD, PVD, ALD, or the like. In some embodiments, the second conductors 176 and/or the third conductors 177 may be conductive plugs and may include conductive materials, such as metals or metal alloys including one or more of Al, AlCu, Cu, Ti, TiN, W, or the like. The second conductors 176 and/or the third conductors 177 may be formed by any suitable method, such as CVD, PVD, or the like. In some embodiment, the second conductors 176 and/or the third conductors 177 may have circular shape in a top view, but are not limited thereto.

In some embodiments, in the case where the semiconductor device 10a is applied to a memory device such as DRAM (e.g., a 1T1C DRAM, a 3T1C DRAM, a COB DRAM, or the like), the source electrodes 170 may be connected to capacitors through the third conductors 176, the drain electrodes 172 may be connected to bit lines through the second conductors 177, and the gate electrodes 120 may serve as word lines and may be electrically connected to the devices in the base substrate 102 through the first conductors 106.

FIG. 5A to FIG. 5F are schematic perspective views that illustrate a method of forming a semiconductor device in accordance with a fifth embodiment. A semiconductor device 40 of the fifth embodiment is similar to the semiconductor device 10 of the first embodiment. That is, some of the processes of forming the semiconductor device 40 and some of structures, materials, and functions of the semiconductor device 40 may be similar to the semiconductor device 10, and thus some of details are omitted herein.

Figure 5A:
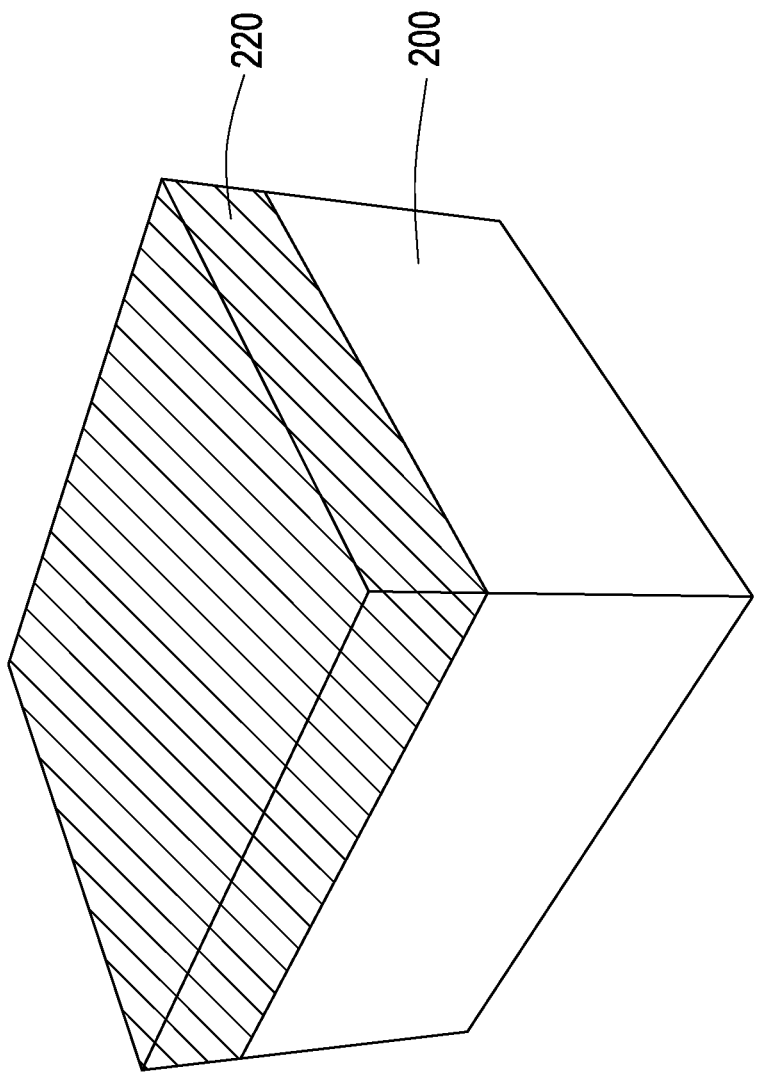
FIG. 5A to FIG. 5F are schematic perspective views that illustrate a method of forming a semiconductor device in accordance with a fifth embodiment.
Figure 5A:
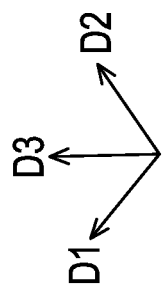
Figure 5B:
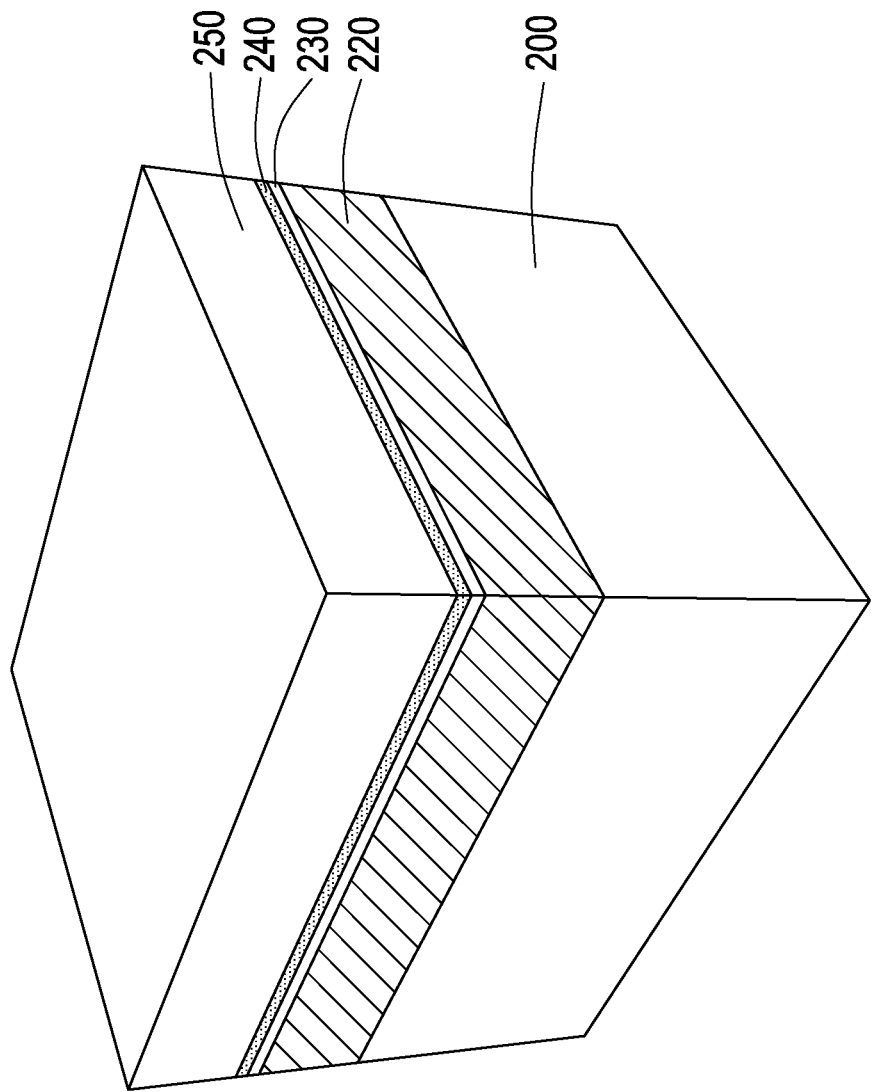
Figure 5C:
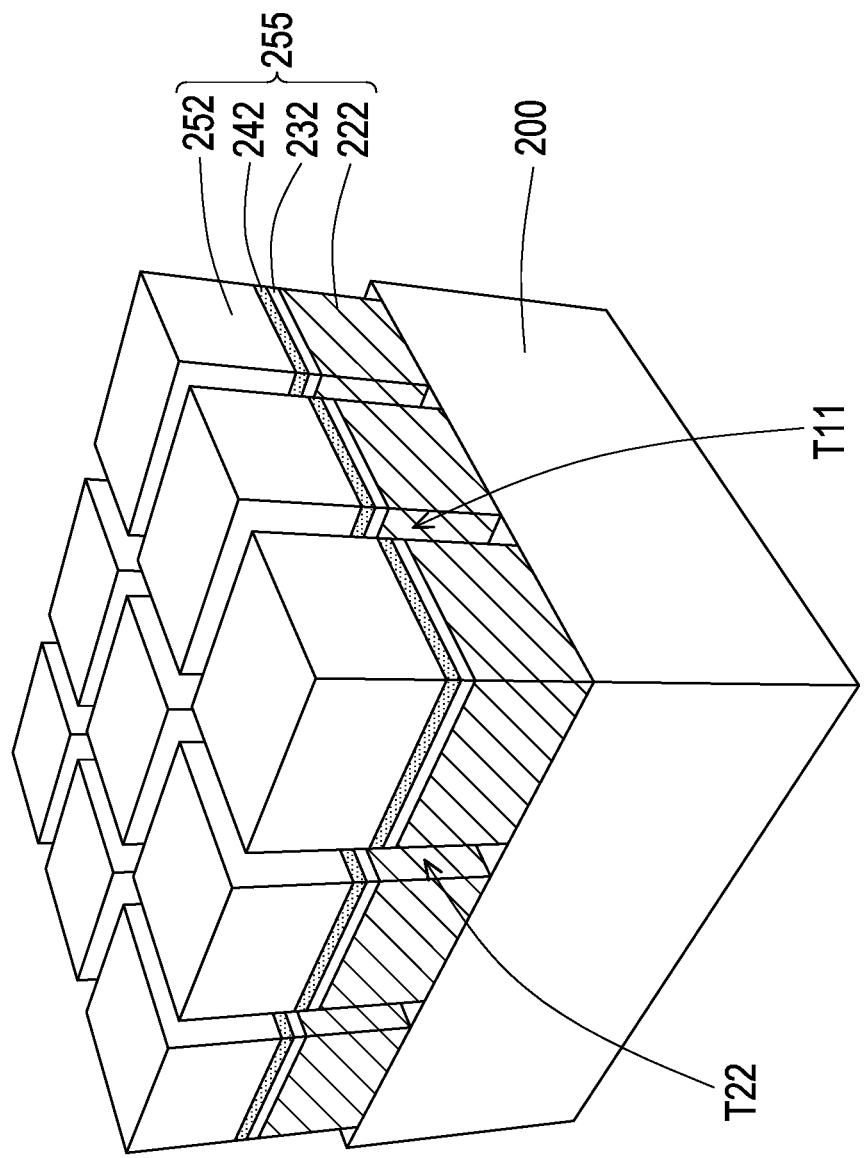
Figure 5C:
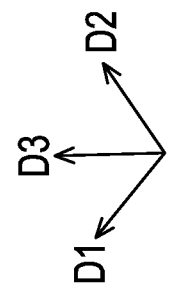
Figure 5D:
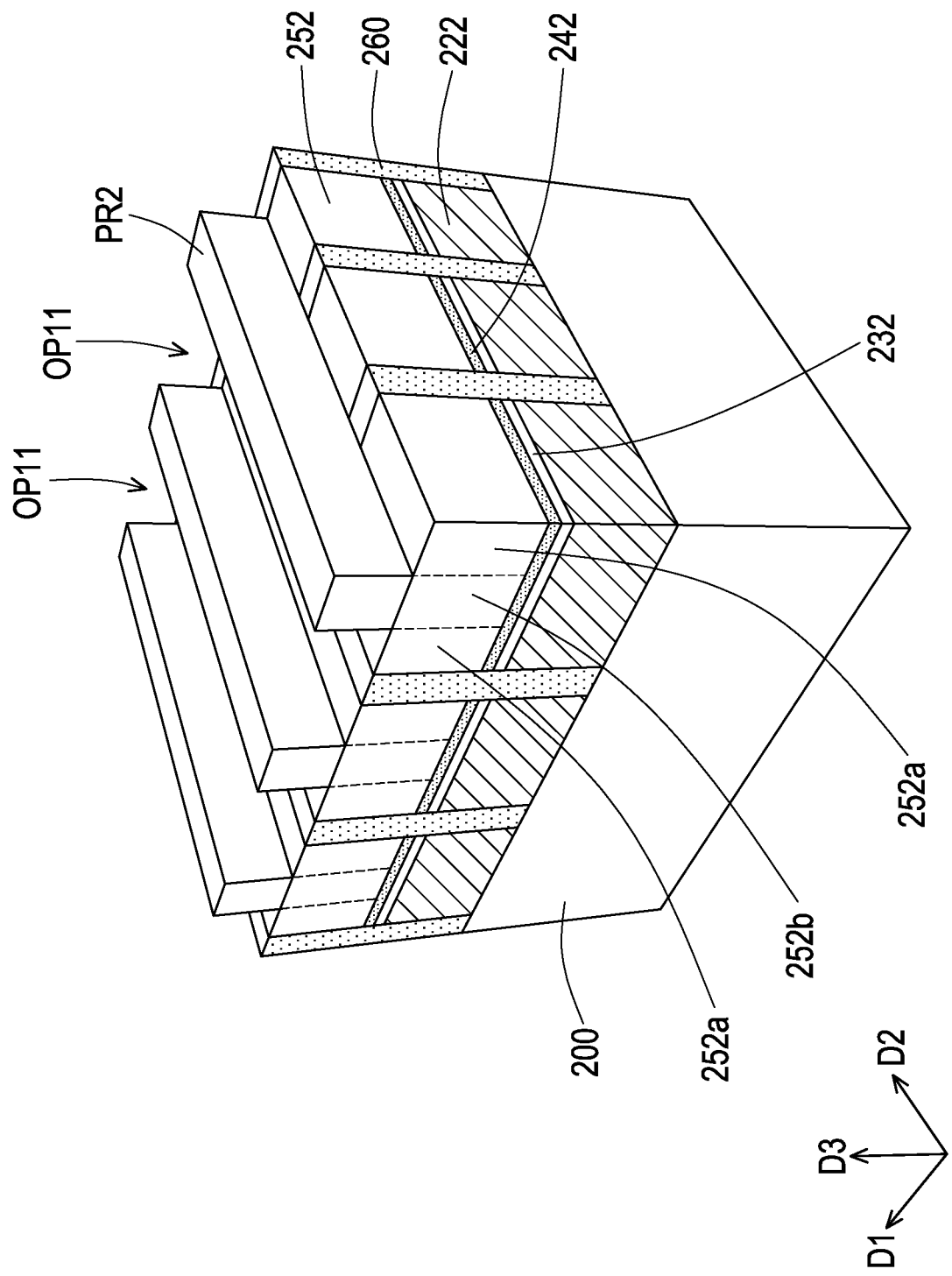
Figure 5E:
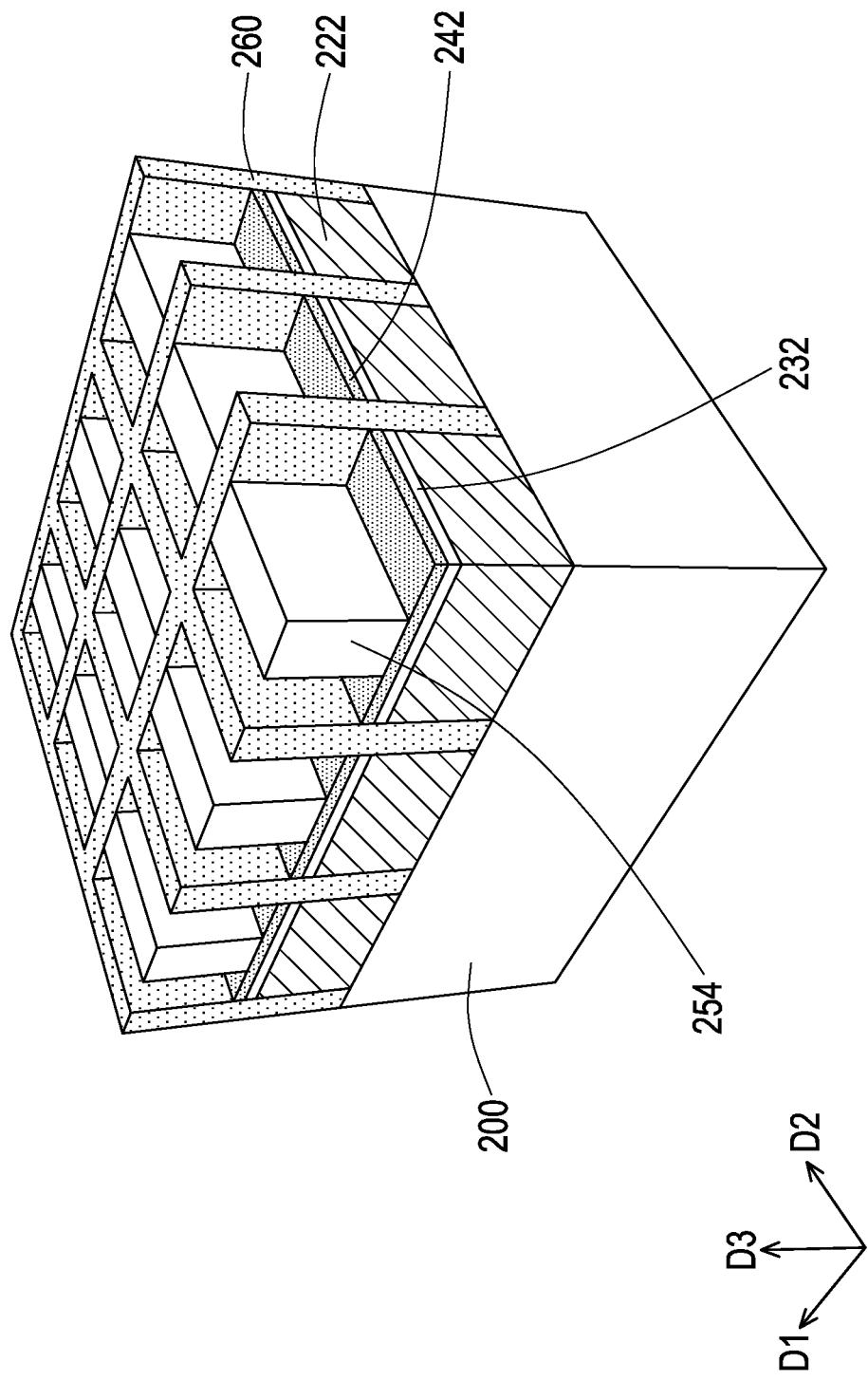
Figure 5F:
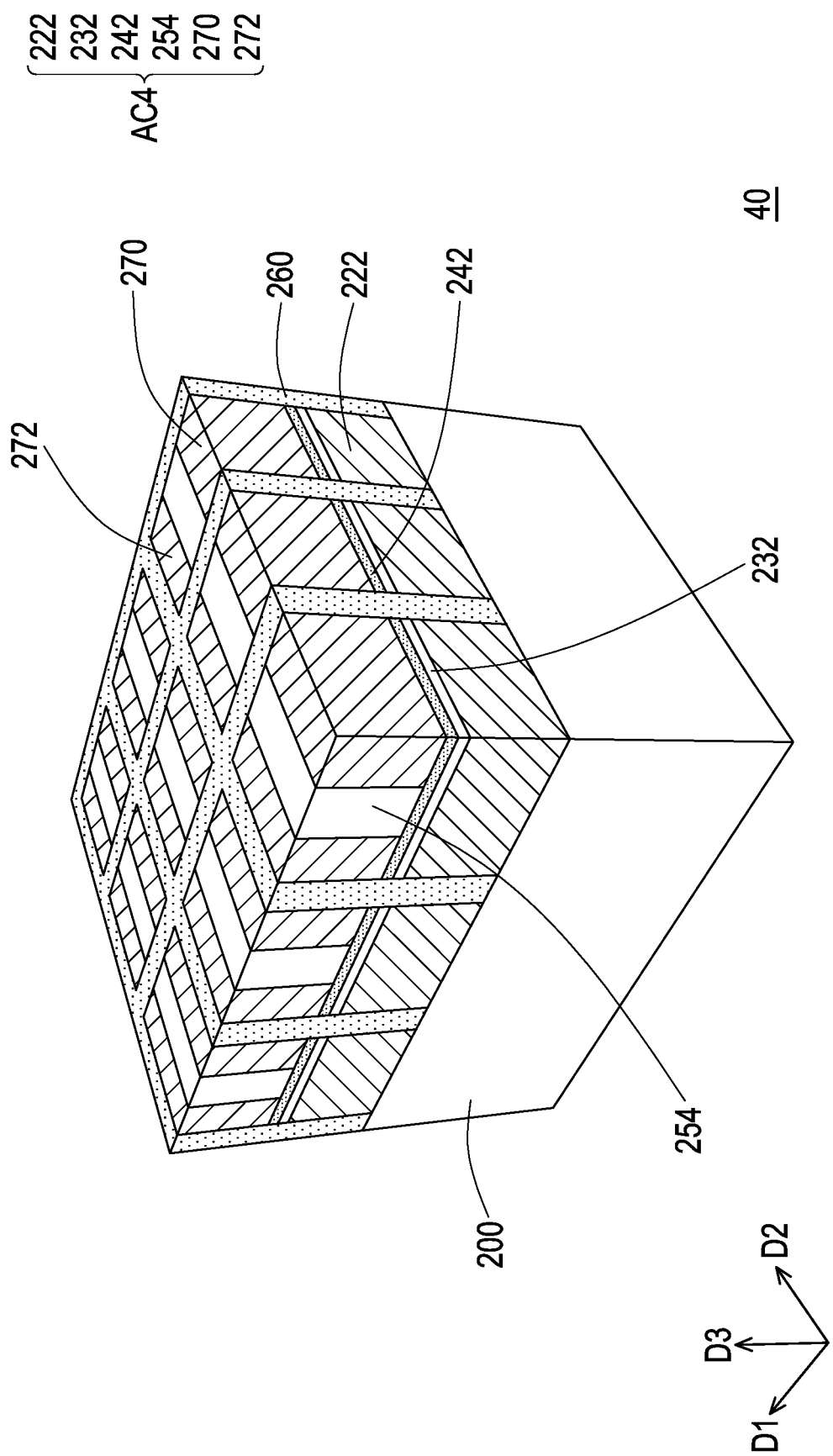

Referring to FIG. 5A, a method of forming a semiconductor device 40 (as shown in FIG. 5F) includes following steps. Firstly, a gate electrode layer 220 is formed on a substrate 200. The substrate 200 of the fourth embodiment is similar to the substrate 100 of the first embodiment. That is, the devises included in the substrate 200 or the structures and materials of the substrate 200 in the fourth embodiment are similar to the devises included in the substrate 100 or the structures and materials of the substrate 100 in the first embodiment, and thus the details are omitted herein. The gate electrode layer 220 may be formed by any suitable method, such as CVD, PVD, or the like. The gate layer 220 may include commonly used gate material such as doped polysilicon, metal (e.g., tungsten, aluminum, etc.), silicide (e.g., titanium silicide, nickel silicide, etc.), or some other suitable conductive materials.

Referring to FIG. 5B, a gate dielectric layer 230, a channel layer 240, a first insulation layer 250 are formed on the gate electrode layer 220 in sequence. The gate dielectric layer 230 of the fourth embodiment is similar to the gate dielectric layer 130 of the first embodiment. The channel layer 240 of the fourth embodiment is similar to the channel layer 140 of the first embodiment. The first insulation layer 250 of the fourth embodiment is similar to the first insulation layer 150 of the first embodiment. That is, the materials and manufacturing methods of the gate dielectric layer 230, channel layer 240, and first insulation layer 250 in the fourth embodiment are similar to those of the gate dielectric layer 130, the channel layer 140, and the first insulation layer 150 in the first embodiment, and thus the details are omitted herein.

Referring to FIGS. 5B and 5C, the gate electrode layer 220, the gate dielectric layer 230, the channel layer 240, and the first insulation layer 250 are patterned to form stacks 255 spaced apart from each other on the substrate 200. The stacks 255 may include gate electrodes 222 on the substrate 200, gate dielectric patterns 232 stacked on the gate electrodes 222, channel patterns 242 stacked on the gate dielectric patterns 232, and first insulation patterns 252 stacked on the channel patterns 242. In some embodiments, the gate electrodes 222, the gate dielectric patterns 232, the channel patterns 242, and the first insulation patterns 252 may be formed by following steps. Firstly, a mask pattern (not illustrated) is formed on the first insulation layer 250. The mask pattern may be a patterned photoresist layer. Then, portions of the first insulation layer 250 exposed by the mask pattern, portions of the channel layer 240 under the portions of the first insulation layer 250, portions of the gate dielectric layer 230 under the portions of the channel layer 240, and portions of the gate electrode layer 220 under the portions of the gate dielectric layer 230 are removed to form the stacks 255 spaced apart from each other on the substrate 200. The portions of the first insulation layer 250, the portions of the channel layer 240, the portions of the gate dielectric layer 230, and the portions of the gate electrode layer 220 may be removed by an etching process. The substrate 200 may serve as a stop layer during the process of removing the portions of the first insulation layer 250, the portions of the channel layer 240, the portions of the gate dielectric layer 230, and the portions of the gate electrode layer 220. After forming the stacks 255, the mask pattern is removed by any suitable method, such as ashing.

In some embodiments, first trenches T11, formed between the stacks 255 in the second direction D2, extend in the first direction D1 and arrange in the second direction D2. Second trenches T22, formed between the stacks 255 in the first direction D1, extend in the second direction D2 and arrange in the first direction D1. In some embodiments, the first trenches T11 and the second trenches T22 may be interlaced with each other to form a grid or mesh pattern in a top view. Each of the first trenches T11 may have a width ranging from about 10 nm to about 30 nm in the second direction D2. Each of the second trenches T22 may have a width ranging from about 10 nm to about 30 nm in the first direction D1. In some embodiments, the widths of the first trenches T11 in the second direction D2 may be about equal to the widths of the second trenches T22 in the first direction D1.

Referring to FIG. 5C and FIG. 5D, a first barrier pattern 260 is formed on the substrate 200 to surround each of the stacks 255. In some embodiments, the first barrier pattern 260 may be formed as a grid or mesh pattern in a top view, and the stacks 255 may fill in openings of the grid or mesh pattern. In some embodiments, the first barrier pattern 260 may be formed by following steps. Firstly, a barrier material is formed on the substrate 200 exposed by the stacks 255 and fill the first trenches T11 and second trenches T22. The barrier material may cover top surfaces of the stacks 255. Then, a planarization process (e.g., a CMP process) is performed to remove excessive barrier material on the top surfaces of the stacks 255, so that the barrier pattern 260 may be formed in the first trenches T11 and second trenches T22 to surround each of the stacks 255. The first barrier pattern 260 may include or may be formed of an insulating material having a different etch selectivity from the first insulation patterns 252. As such, the first barrier pattern 260 may serve as a mask during a process of patterning the first insulation patterns 252 in subsequent processes for forming a self-aligned source/drain. For example, the first barrier pattern 260 may include aluminum oxide, titanium oxide, silicon nitride, or the like. In some embodiments, the barrier material may include materials which can be treat as an absorption source to protect the channel patterns 242 from impurities and/or interstitial atoms (e.g., hydrogen atom, oxygen atom, or the like) to make device electrical properties healthier and more stable. For example, the first barrier pattern 260 may include materials such as aluminum oxide, titanium oxide, or the like. The barrier material may be formed by any suitable method, such as CVD, PVD, ALD, or the like.

Referring to FIG. 5D and FIG. 5E, each of the first insulation patterns 252 is patterned to form second insulation patterns 254 spaced apart from each other in the first direction D1 on the channel pattern 242. In some embodiments, the second insulation patterns 254 are formed by following steps. Firstly, a mask pattern PR2 is formed on the first insulation patterns 252. The mask pattern PR2 may include openings OP11 exposed first portions 252a of the first insulation patterns 252 and portions of the first barrier pattern 260 located between the first portions 252a of the first insulation patterns 252. The mask pattern PR2 covers second portions 252b of the first insulation patterns 252 between the first portions 252a of the first insulation patterns 252. The mask pattern may be a patterned photoresist layer. Then, the first portions 252a of the first insulation patterns 252 are removed through the openings OP11 of the mask pattern PR2 to form the second insulation patterns 254 on each of the channel patterns 242. The first portions 252a of the first insulation patterns 252 are removed by an etching process. Since the first barrier pattern 260 includes or is formed of an insulating material having a different etch selectivity from the first insulation patterns 252, the first barrier pattern 260 may serve as a mask during the process of patterning the first insulation patterns 252. In other words, portions of the first barrier pattern 260 exposed by the mask pattern PR2, such as portions of the first barrier pattern 260 between the first portions 252a of the first insulation patterns 252, may retain on the substrate 200. The channel patterns 242 may serve as a stop layer during the process of patterning the first insulation patterns 252. After forming the second insulation patterns 254, the mask pattern PR2 is removed by any suitable method, such as ashing.

Referring to FIGS. 5E and 5F, source electrode 270 and drain electrode 272 are formed between the first barrier pattern 260 and the second insulation patterns 254 on each of the channel patterns 242. In some embodiments, the second insulation patterns 254 may be located between the source electrode 270 and the drain electrode 272 in a top view. In some embodiments, the source electrodes 270 and the drain electrodes 272 may be formed by following steps. Firstly, a conductive material (not shown) is formed on the channel patterns 242 to cover the second insulation patterns 254 and the first barrier pattern 260. The conductive material may cover top surfaces of the second insulation patterns 254 and a top surface of the first barrier pattern 260. The conductive material may be formed by any suitable method, such as CVD, PVD, or the like. Then, a planarization process (e.g., CMP process) is performed to remove a portion of the conductive material on the top surface of the second insulation patterns 254 and on the top surface of the first barrier pattern 260 to form the source electrodes 270 and the drain electrodes 272. The top surfaces of the source electrodes 270 and the drain electrodes 272 may be coplanar with the top surfaces of the second insulation patterns 254 and the first barrier pattern 260. The source electrodes 270 may include commonly used source material such as Al, Ti, TiN, W, Mo, indium tin oxide (ITO), or some other suitable conductive materials. The drain electrodes 272 may include commonly used drain material such as Al, Ti, TiN, W, Mo, indium tin oxide (ITO), or some other suitable conductive materials.

In some embodiments, in the case where the first barrier pattern 260 includes or is formed of an insulating material having a different etch selectivity from the first insulation patterns 252. The first barrier pattern 260 may serve as a mask during the process of patterning the first insulation patterns 252, so that the source electrodes 270 formed between the second insulation patterns 254 and the first barrier pattern 260 may be considered as self-aligned sources. Namely, as shown in FIG. 5F, sidewalls of the channel patterns 242 that are in contact with the first barrier pattern 260 are substantially coplanar with sidewalls of the source electrodes 270 that are in contact with the first barrier pattern 260. Also, the drain electrodes 272 formed between the second insulation patterns 254 and the first barrier pattern 260 may be considered as self-aligned drains. Namely, as shown in FIG. 5F, sidewalls of the channel patterns that are in contact with the first barrier pattern 260 are substantially coplanar with sidewalls of the drain electrodes 272 that are in contact with the first barrier pattern 260. On the other hands, sidewalls of the channel patterns 142 that are in contact with the first barrier pattern 260 and cross under the source electrodes 270, the drain electrodes 272, and the second insulation patterns 254 may be substantially coplanar with sidewalls of the second insulation patterns 254 that are in contact with the first barrier pattern 260.

From the foregoing processes, the method of forming the semiconductor device 40, as shown in FIG. 5F, may achieve a self-aligned device without overlay shift in photo lithography processes, which may reduce the process variation and enlarge the gate width and gate-controlled channel area and thereby improving the consistency of device electrical properties and device performance. Also, the masks used in the processes of forming the semiconductor device 10 can be reduced and thus the cost of the process is competitive. On the other hands, upon the foregoing processes of forming the semiconductor device 40, the semiconductor device 40 may be suitable to apply to any BEOL process.

Referring to FIG. 5F, the semiconductor device 40 may include active components AC4 arranged in an array on the substrate 200. In some embodiments, each of the active components AC4 may include one of the channel patterns 242, one of the gate dielectric patterns 232 under the one of the channel patterns 242, one of the gate electrodes 222 under the one of the gate dielectric patterns 232, one of the source electrodes 270 on the one of the channel patterns 242, one of the drain electrodes 272 on the one of the channel patterns 242, and one of the second insulation patterns 254 between the one of the source electrodes 270 and the one of the drain electrodes 272. Namely, each of the active components AC4 in the semiconductor device 40 shown in FIG. 5F may include one transistor (e.g., TFT). Since the first barrier pattern 260 surrounds the active components AC4, electrical properties of the active components AC4 can be improved and stand stable.

In some embodiments, in the case where the semiconductor device 40 is applied to a memory device such as DRAM (e.g., a 1T1C DRAM, a 3T1C DRAM, a COB DRAM, or the like), the source electrodes 270 may be connected to capacitors, the drain electrodes 272 may be connected to bit lines, and the gate electrodes 120 may be connected to a common word line.

Figure 6:
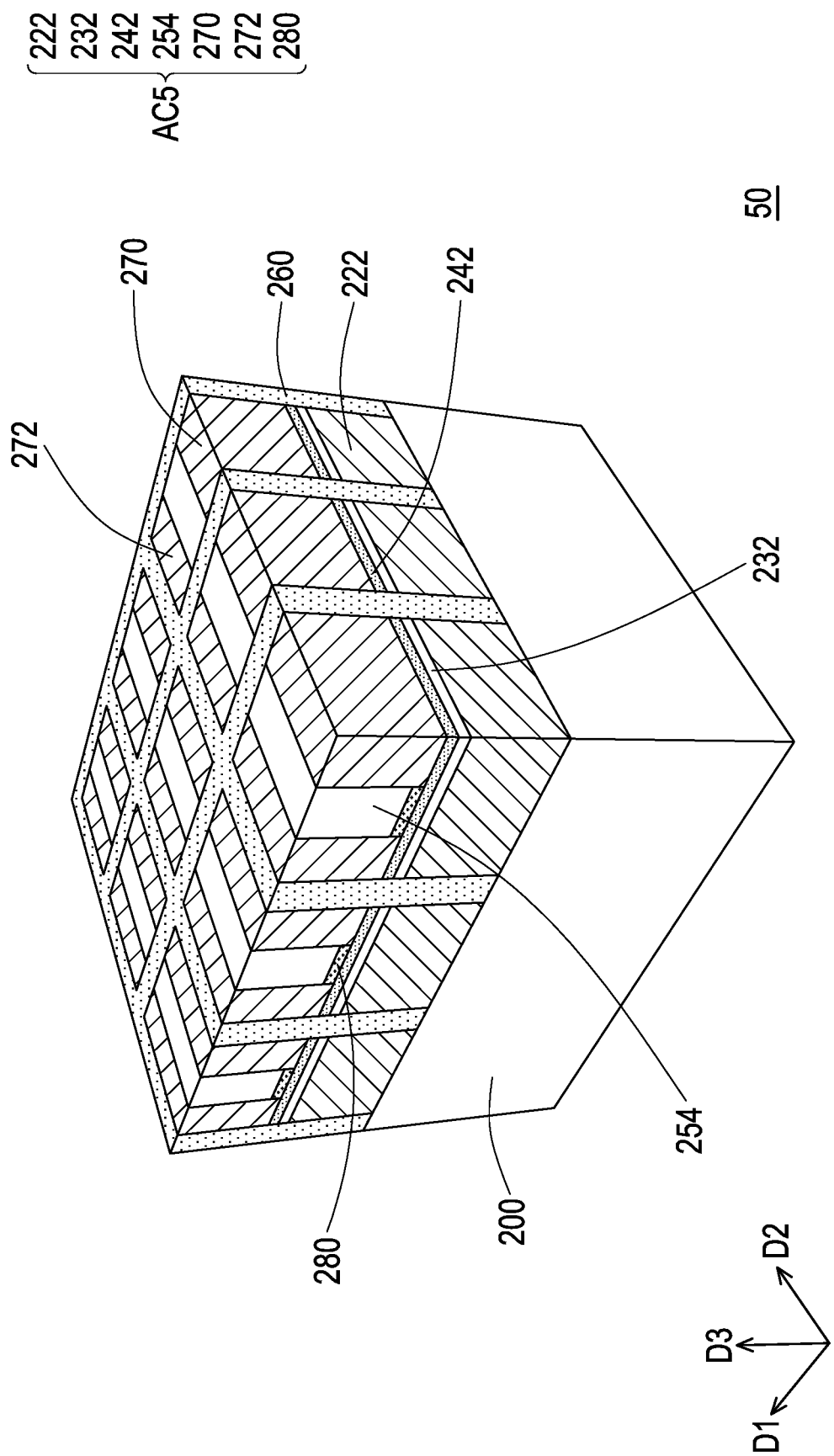
FIG. 6 is a schematic perspective view illustrating a semiconductor device in accordance with a sixth embodiment.

FIG. 6 is a schematic perspective view illustrating a semiconductor device in accordance with a sixth embodiment.

Referring to FIG. 6, a semiconductor device 50 of the sixth embodiment is similar to the semiconductor device 40 of the fifth embodiment. That is, the structures, materials, and functions of active components AC5 in the semiconductor device 50 are similar to those of the active components AC4 in the semiconductor device 40, and thus the details are omitted herein. The main difference between the active components AC5 and the active components AC4 lies in that each of the active components AC5 further includes second barrier patterns 280 between the second insulation patterns 254 and the channel pattern 242. The second barrier patterns 280 may provide a protection from impurities and/or interstitial atoms (e.g., hydrogen atom, oxygen atom, or the like) to make device electrical properties healthier and more stable. For example, the second barrier patterns 280 may include materials which can be treat as an absorption source to protect the channel patterns 242 from the impurities and/or interstitial atoms to make device electrical properties healthier and more stable. For example, the second barrier patterns 280 may include materials such as aluminum oxide, titanium oxide, or the like. The second barrier patterns 280 may be formed by any suitable method, such as CVD, PVD, ALD, or the like. The thickness of the second barrier patterns 280 in the third direction D3 may be about 15 nm to about 100 nm.

In some embodiments, a method of forming the second barrier patterns 280 may include following steps. Firstly, a barrier layer (not shown) is formed on the channel layer 240 before the first insulation layer 250 is formed on the channel layer 240 (e.g., referring to FIG. 5B). Next, the first insulation layer 250, the barrier layer, the channel layer 240, the gate dielectric layer 230, and the gate electrode layer 220 are patterned to form the first insulation patterns 252, the barrier patterns, the channel patterns 242, the gate dielectric patterns 232, and the gate electrodes 222 (e.g., referring to FIG. 5C). Then, the barrier patterns are patterned during the process of patterning the first insulation pattern 252 to form the second barrier patterns 280 between the second insulation patterns 254 and the channel patterns 242 (e.g., referring to FIG. 5E).

Figure 7:
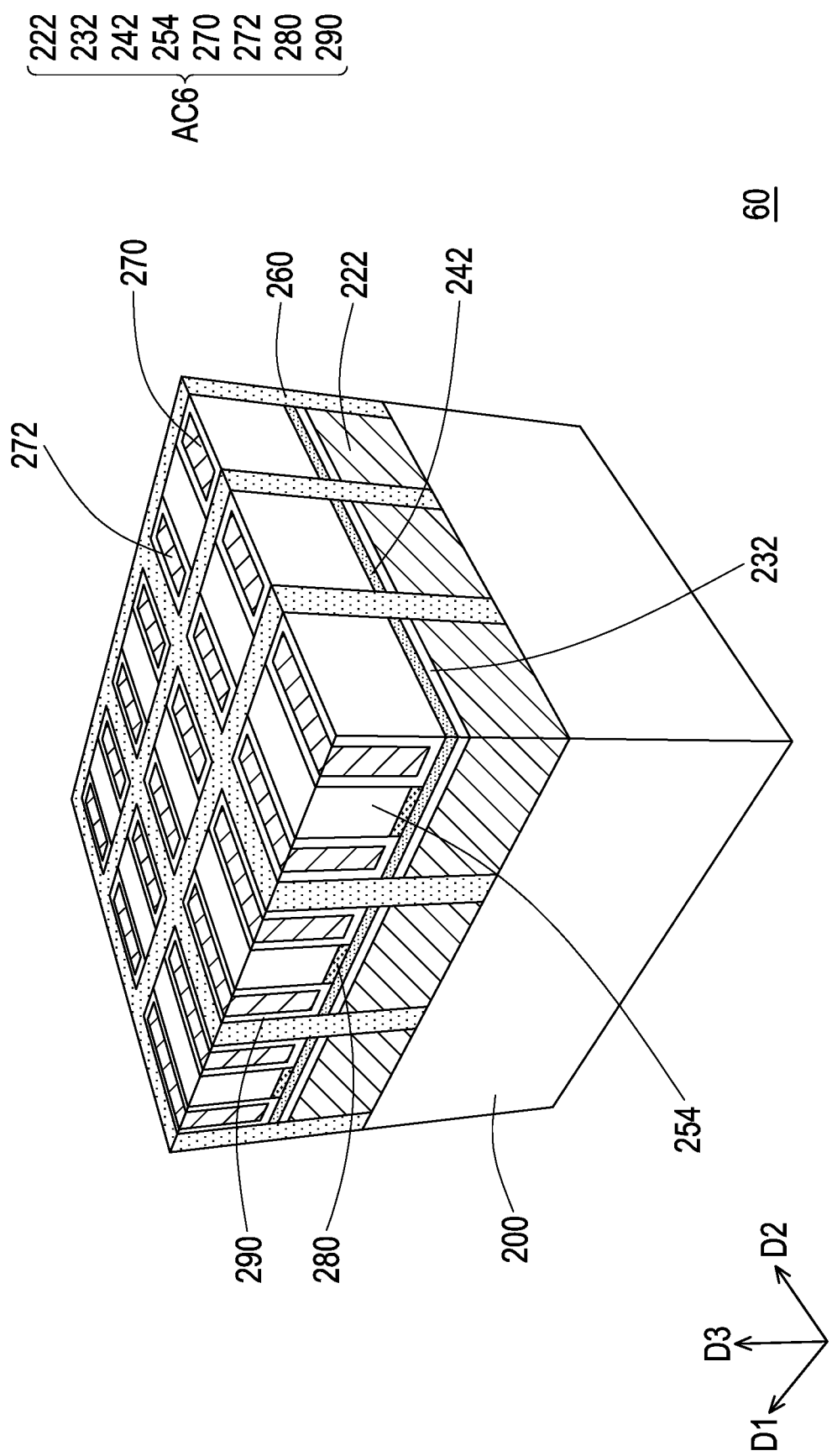
FIG. 7 is a schematic perspective view illustrating a semiconductor device in accordance with a seventh embodiment.

FIG. 7 is a schematic perspective view illustrating a semiconductor device in accordance with a seventh embodiment.

Referring to FIG. 7, a semiconductor device 60 of the seventh embodiment is similar to the semiconductor device 50 of the sixth embodiment. That is, the structures, materials, and functions of active components AC6 in the semiconductor device 60 are similar to those of the active components AC5 in the semiconductor device 50, and thus the details are omitted herein. The main difference between the active components AC6 and the active components AC5 lies in that each of the active components AC6 further includes conductive patterns 290 between the source electrode 270 and the channel pattern 242 and between the drain electrode 272 and the channel pattern 242. The conductive patterns 290 may include a low-resistivity material to turn the Schottky contact between the source electrodes 270 and the channel patterns 242 and between the drain electrodes 272 and the channel patterns 242 into Ohmic contact. Also, since the conductive patterns 290 are formed before the process of forming the source electrodes 270 and the drain electrode 272 and after the process of patterning the first insulation pattern 252 (see FIG. 5E), the conductive patterns 290 may ameliorate interfaces between the source electrodes 270 and the channel patterns 242 and between the drain electrode 272 and the channel patterns 242. That is because the conductive patterns 290 may capture impurities and/or interstitial atoms (e.g., hydrogen atom) on regions of the channel patterns 242 on which the source electrodes 270 and the drain electrodes 272 are formed in the subsequent process. Based on the above, the conductive patterns 290 may improve the performance of the active components AC6 by decreasing parasitic resistance between the source electrodes 270 and the channel patterns 242 and between the drain electrodes 272 and the channel patterns 242 to have better control on the channels.

The conductive patterns 290 may include oxide semiconductors such as indium IGZO, indium oxide (InO), ZnO, indium zinc oxide (IZO), or the like. In some embodiments, the conductive patterns 290 may include some materials included in the channel patterns 242. The conductive patterns 290 may be formed by any suitable method, such as CVD, PVD, ALD, or the like.

Figure 8:
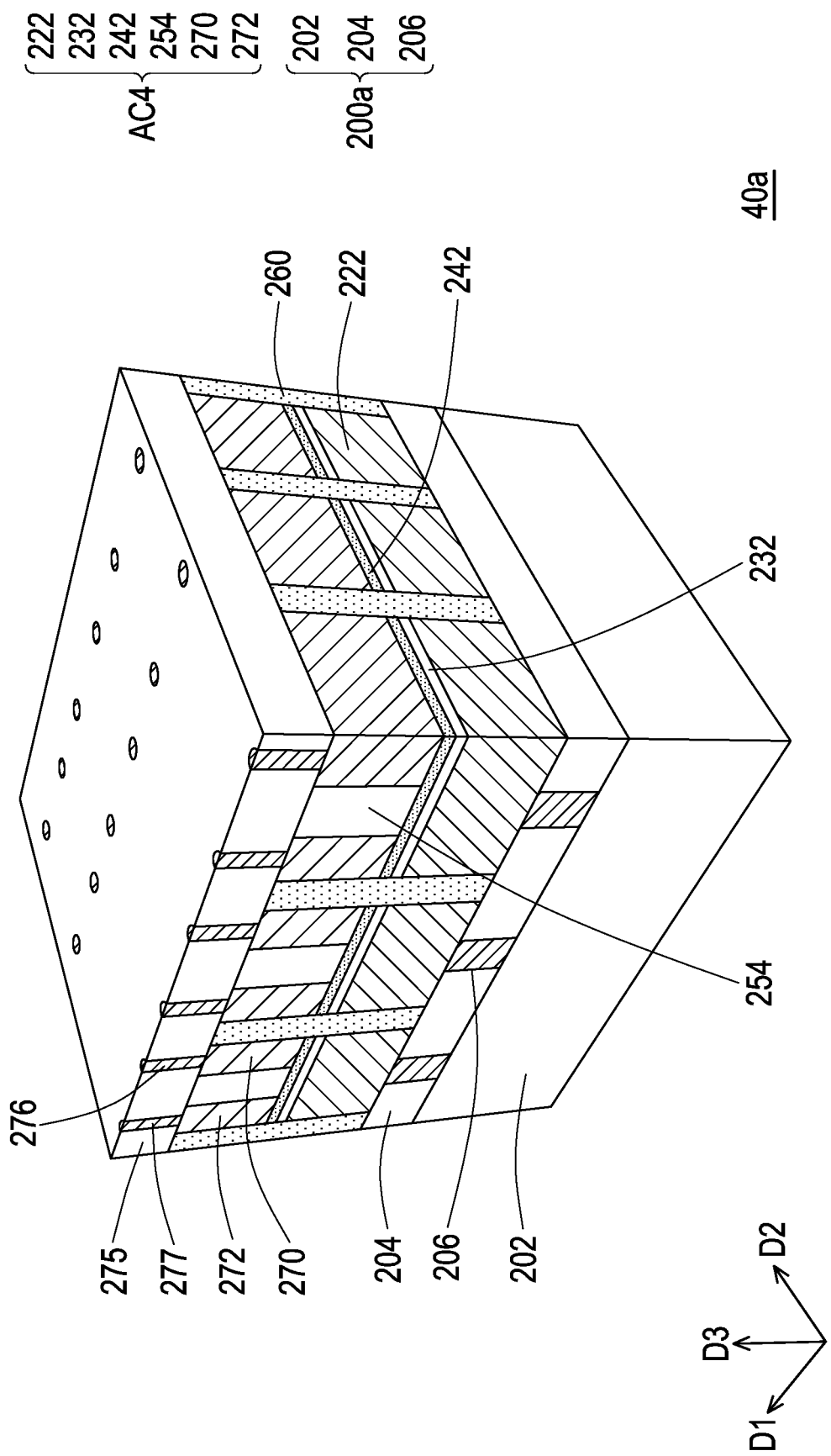
FIG. 8 is a schematic perspective view illustrating a semiconductor device in accordance with an eighth embodiment.

FIG. 8 is a schematic perspective view illustrating a semiconductor device in accordance with an eighth embodiment.

Referring to FIG. 8, a semiconductor device 40a of the eighth embodiment is similar to the semiconductor device 40 of the seventh embodiment. One of differences between the semiconductor device 40a and the semiconductor device 40 lies in that the substrate 200a of the semiconductor device 40a includes a base substrate 202, a first dielectric layer 204 on the base substrate 202, and first conductors 206 in the first dielectric layer 204. In some embodiments, the base substrate 202 may include a semiconductor substrate, a device layer on the semiconductor substrate, and an interconnection layer on the device layer. The semiconductor substrate may be a bulk semiconductor, a semiconductor-on-insulator (SOI) substrate, or the like. The device layer may include a wide variety of devices and ILD layers covering the devices. Another one of differences between the semiconductor device 40a and the semiconductor device 40 lies in that the semiconductor device 40a further includes a second dielectric layer 275, second conductors 276, and third conductors 277. The second dielectric layer 275 disposes on the first barrier pattern 260, the second insulation patterns 254, the source electrodes 270, and the drain electrodes 272. The second conductors 276 are disposed in the second dielectric layer 275 and electrically connected to the source electrodes 270. The third conductors 277 are disposed in the second dielectric layer 275 and electrically connected to the drain electrodes 272.

In some embodiments, the first dielectric layer 204 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The first dielectric layer 204 may be formed by any suitable method, such as CVD, PVD, ALD, or the like. In some embodiments, the first conductors 206 may be conductive plugs and may include conductive materials, such as metals or metal alloys including one or more of Al, AlCu, Cu, Ti, TiN, W, or the like. The first conductors 206 may be formed by any suitable method, such as CVD, PVD, or the like. In some embodiment, the first conductors 206 may have circular shape in a top view, but are not limited thereto.

In some embodiments, the second dielectric layer 275 includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The second dielectric layer 275 may be formed by any suitable method, such as CVD, PVD, ALD, or the like. In some embodiments, the second conductors 276 and/or the third conductors 277 may be conductive plugs and may include conductive materials, such as metals or metal alloys including one or more of Al, AlCu, Cu, Ti, TiN, W, or the like. The second conductors 276 and/or the third conductors 277 may be formed by any suitable method, such as CVD, PVD, or the like. In some embodiment, the second conductors 276 and/or the third conductors 277 may have circular shape in a top view, but are not limited thereto.

In some embodiments, in the case where the semiconductor device 40a is applied to a memory device such as DRAM (e.g., a 1T1C DRAM, a 3T1C DRAM, a COB DRAM, or the like), the source electrodes 270 may be connected to capacitors through the third conductors 277, the drain electrodes 272 may be connected to bit lines through the second conductors 277, and the gate electrodes 120 may be connected to a common word line through the first conductors 206.

According to some embodiments, a semiconductor device includes active components and a first barrier pattern. The active components are disposed on a substrate, and each of the active components includes base insulation patterns, gate electrodes, a gate dielectric layer, a channel pattern, source electrodes, a drain electrode, and second insulation patterns. The base insulation patterns, disposed on the substrate, extend in a first direction and space apart from each other in a second direction different from the first direction. The gate electrodes, disposed on the substrate, extend in the first direction and space apart from each other with the base insulation patterns interposed therebetween. The gate dielectric layer is disposed on the gate electrodes and the base insulation patterns. The channel pattern is disposed on the gate dielectric layer. The source electrodes are disposed on the channel pattern and spaced apart from each other. The drain electrode is disposed on the channel pattern and between the source electrodes. The second insulation patterns are disposed on the channel pattern and between the source electrodes and the drain electrode. The first barrier pattern is disposed on the gate dielectric layer and surrounding the channel patterns, the source electrodes, the drain electrodes, and the second insulation patterns in each of the active components.

According to some embodiments, a semiconductor device includes active components and a first barrier pattern. The active components space apart from each other on a substrate, and each of the active components include a gate electrode disposed on the substrate, a gate dielectric pattern disposed on the gate electrode, a channel pattern disposed on the gate dielectric pattern, a source electrode and a drain electrode disposed on the channel pattern and spaced apart from each other, and an insulation pattern disposed between the source electrode and the drain electrode. The first barrier pattern surrounds each of the active components.

According to some embodiments, a method of forming a semiconductor device includes following steps: forming base insulation patterns on a substrate; forming gate electrodes on the substrate and between the base insulation patterns; forming a gate dielectric layer on the base insulation patterns and the gate electrodes; forming a channel layer on the gate dielectric layer; forming a first insulation layer on the channel layer; patterning the first insulation layer and the channel layer to form stacks spaced apart from each other on the gate dielectric layer, wherein each of the stacks comprises a channel pattern and a first insulation pattern stacked on the channel pattern; forming a barrier pattern on the gate dielectric layer to surround each of the stacks; patterning the first insulation patterns to form second insulation patterns spaced apart from each other on each of the channel patterns; forming source electrodes between the first barrier pattern and the second insulation patterns on each of the channel patterns; and forming a drain electrode between the second insulation patterns on each of the channel patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
active components disposed on a substrate, wherein each of the active components comprises:
base insulation patterns disposed on the substrate, extending in a first direction, and spaced apart from each other in a second direction different from the first direction;
gate electrodes disposed on the substrate, extending in the first direction, and spaced apart from each other with the base insulation patterns interposed therebetween;
a gate dielectric layer disposed on the gate electrodes and the base insulation patterns;
a channel pattern disposed on the gate dielectric layer;
source electrodes disposed on the channel pattern and spaced apart from each other;
a drain electrode disposed on the channel pattern and between the source electrodes; and
second insulation patterns disposed on the channel pattern and between the source electrodes and the drain electrode; and
a first barrier pattern disposed on the gate dielectric layer and surrounding the channel patterns, the source electrodes, the drain electrodes, and the second insulation patterns in each of the active components.

2. The semiconductor device of claim 1, wherein the second insulation patterns in each of the active components are spaced apart from each other.

3. The semiconductor device of claim 1, wherein the first barrier pattern comprises an insulating material having a different etch selectivity from the second insulation patterns.

4. The semiconductor device of claim 1, wherein the channel pattern comprises first sidewalls opposite to each other and extending in the first direction and second sidewalls opposite to each other and extending in the second direction, and
the first sidewalls of the channel pattern are substantially coplanar with sidewalls of the source electrodes that are in contact with the first barrier pattern and extend in the first direction.

5. The semiconductor device of claim 4, wherein the second sidewalls of the channel pattern are substantially coplanar with sidewalls of the source electrodes that are in contact with the first barrier pattern and extend in the second direction.

6. The semiconductor device of claim 4, wherein the second sidewalls of the channel pattern are substantially coplanar with sidewalls of the drain electrode that are in contact with the first barrier pattern.

7. The semiconductor device of claim 4, wherein the second sidewalls of the channel pattern are substantially coplanar with sidewalls of the second insulation patterns that are in contact with the first barrier pattern.

8. The semiconductor device of claim 1, wherein the drain electrode comprises a first portion overlapping one of the gate electrodes in a third direction perpendicular to the first direction and the second direction, a second portion overlapping another one of the gate electrodes in the third direction, and a third portion between the first portion and the second portion and overlapping the channel pattern in the third direction.

9. The semiconductor device of claim 1, wherein each of the active components comprise second barrier patterns between the second insulation patterns and the channel pattern and between the source electrodes and the drain electrode.

10. The semiconductor device of claim 1, wherein each of the active components comprise conductive patterns between the source electrodes and the channel pattern and between the drain electrode and the channel pattern.

11. A semiconductor device, comprising:
active components spaced apart from each other on a substrate, wherein each of the active components comprises:
a gate electrode disposed on the substrate;
a gate dielectric pattern disposed on the gate electrode;
a channel pattern disposed on the gate dielectric pattern;
a source electrode and a drain electrode disposed on the channel pattern and spaced apart from each other; and
an insulation pattern disposed between the source electrode and the drain electrode; and
a first barrier pattern surrounding each of the active components, wherein each of the active components further comprises a second barrier pattern between the insulation pattern and the channel pattern and between the source electrode and the drain electrode.

12. The semiconductor device of claim 11, wherein the first barrier pattern comprises an insulating material having a different etch selectivity from the insulation pattern.

13. The semiconductor device of claim 11, wherein sidewalls of the channel patterns that are in contact with the first barrier pattern are substantially coplanar with sidewalls of the source electrodes and the drain electrodes that are in contact with the first barrier pattern.

14. The semiconductor device of claim 11, wherein sidewalls of the insulation pattern that are in contact with the first barrier pattern are substantially coplanar with sidewalls of the channel pattern that cross under the source electrode, the drain electrode, and the insulation pattern.

15. The semiconductor device of claim 11, wherein the insulation pattern is spaced apart from the channel pattern by the second barrier pattern.

16. The semiconductor device of claim 11, wherein each of the active components comprises conductive patterns between the source electrode and the channel pattern and between the drain electrode and the channel pattern.

17. A semiconductor device, comprising:
   an active component disposed on a substrate, wherein the active component comprises:
      a gate electrode disposed on the substrate;
      a gate dielectric pattern disposed on the gate electrode;
      a channel pattern disposed on the gate dielectric pattern;
      a source electrode and a drain electrode disposed on the channel pattern and spaced apart from each other; and
      an insulation pattern disposed between the source electrode and the drain electrode; and
   a first barrier pattern surrounding each of the active component,
   wherein sidewalls of the insulation pattern that are in contact with the first barrier pattern substantially align with sidewalls of the channel pattern that are in contact with the first barrier pattern.

18. The semiconductor device of claim 17 further comprising:
   a first dielectric layer disposed between the substrate and the gate electrode; and
   a first conductor penetrating through the first dielectric layer, wherein the first conductor is electrically connected to the gate electrode.

19. The semiconductor device of claim 18 further comprising:
   a second dielectric layer covering the active component and the first barrier pattern; and
   second conductors penetrating through the second dielectric layer, wherein the second conductors are electrically connected to the source electrode and the drain electrode.

20. The semiconductor device of claim 17, wherein the first barrier pattern is in contact with the gate dielectric pattern and the channel pattern.

\* \* \* \* \*